United States Patent
Lee et al.

(10) Patent No.: US 9,768,070 B1
(45) Date of Patent: Sep. 19, 2017

(54) METHOD FOR MANUFACTURING SEMICONDUCTOR DEVICE

(71) Applicant: SAMSUNG ELECTRONICS CO., LTD., Suwon-si, Gyeonggi-do (KR)

(72) Inventors: Hyung-Suk Lee, Suwon-si (KR); Dong-Kwon Kim, Gimcheon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/160,007

(22) Filed: May 20, 2016

(51) Int. Cl.
| | |
|---|---|
| *H01L 29/66* | (2006.01) |
| *H01L 29/51* | (2006.01) |
| *H01L 21/768* | (2006.01) |
| *H01L 21/3213* | (2006.01) |
| *H01L 23/50* | (2006.01) |
| *H01L 21/8234* | (2006.01) |
| *H01L 21/3105* | (2006.01) |
| *H01L 21/033* | (2006.01) |
| *H01L 21/02* | (2006.01) |

(52) U.S. Cl.
CPC .. *H01L 21/823437* (2013.01); *H01L 21/0217* (2013.01); *H01L 21/0332* (2013.01); *H01L 21/0337* (2013.01); *H01L 21/31051* (2013.01); *H01L 21/32139* (2013.01)

(58) Field of Classification Search
CPC ......... H01L 21/28052; H01L 29/66545; H01L 27/11524; H01L 27/11521
USPC .......... 257/E21.421, E21.409; 438/587, 257, 438/588, 592, 593, 594
See application file for complete search history.

(56) References Cited

U.S. PATENT DOCUMENTS

| | | | |
|---|---|---|---|
| 6,423,627 B1 | 7/2002 | Carter et al. | |
| 6,638,805 B2 | 10/2003 | Park et al. | |
| 6,974,770 B2 | 12/2005 | Costrini et al. | |
| 7,074,661 B2 | 7/2006 | Cho et al. | |
| 7,205,232 B2 | 4/2007 | Yun et al. | |
| 7,476,625 B2 | 1/2009 | Lee et al. | |

(Continued)

FOREIGN PATENT DOCUMENTS

| | | |
|---|---|---|
| KR | 1020030096660 | 12/2003 |
| KR | 1020040037416 | 5/2004 |
| KR | 1020050024977 | 3/2005 |

*Primary Examiner* — Kimberly Rizkallah
*Assistant Examiner* — Brian Turner
(74) *Attorney, Agent, or Firm* — F. Chau & Associates, LLC

(57) ABSTRACT

Provided is a method for manufacturing a semiconductor device, which can secure a sufficient margin in a process of forming a self-aligned contact. The method includes forming a plurality of gate structures arranged in parallel on a substrate and being spaced apart from each other, each of the plurality of gate structures including a conductive layer and a capping layer formed on the conductive layer, forming a first insulation layer between each of the plurality of gate structures, recessing top portions of the plurality of gate structures, forming a block layer along a top surface of the first insulation layer and the recessed top portions of the plurality of gate structures, forming a hardmask layer on the block layer, forming a hardmask pattern on each of the plurality of gate structures by planarizing a top portion of the block layer and a top portion of the hardmask layer, and forming a second insulation layer along a top surface of the block layer and top surfaces of the hardmask patterns.

24 Claims, 25 Drawing Sheets

(56) References Cited

U.S. PATENT DOCUMENTS

| | | |
|---|---|---|
| 7,541,271 B2 | 6/2009 | Chung |
| 7,670,942 B2 | 3/2010 | Kim et al. |
| 7,714,378 B2 | 5/2010 | Kim et al. |
| 2006/0270152 A1* | 11/2006 | Jeong ................ H01L 27/11521 438/253 |
| 2012/0028454 A1* | 2/2012 | Swaminathan ....... C23C 16/045 438/558 |
| 2014/0264487 A1* | 9/2014 | Pham ...................... H01L 29/78 257/288 |
| 2015/0035086 A1* | 2/2015 | Xie .................. H01L 29/66545 257/411 |

* cited by examiner

1200

1300

1400

METHOD FOR MANUFACTURING SEMICONDUCTOR DEVICE

TECHNICAL FIELD

The present inventive concept relates to a method for manufacturing a semiconductor device.

DISCUSSION OF RELATED ART

With the continue increase in the amount of components within the same volume of a semiconductor device toward a higher degree of integration and the reduction in sizes of the semiconductor patterns, it generally requires sufficient margin in the semiconductor process. In particular, it requires sufficient margin in the etching process for forming a self-aligned contact to ensure insulation between the contact and another semiconductor layer while satisfying a reduced design rule.

SUMMARY

The present inventive concept provides a method for manufacturing a semiconductor device, which can secure a sufficient margin in a process of forming a self-aligned contact.

According to an aspect of the present inventive concept, there is provided a method for manufacturing a semiconductor device, the method including: forming a plurality of gate structures arranged in parallel on a substrate and being spaced apart from each other, each of the plurality of gate structures including a conductive layer and a capping layer formed on the conductive layer; forming a first insulation layer between each of the plurality of gate structures; recessing top portions of the plurality of gate structures; forming a block layer along a top surface of the first insulation layer and the recessed top portions of the plurality of gate structures; forming a hardmask layer on the block layer; forming a hardmask pattern on each of the plurality of the gate structures by planarizing a top portion of the block layer and a top portion of the hardmask layer; and forming a second insulation layer along a top surface of the block layer and a top surface of the hardmask pattern.

The first insulation layer and the capping layer of the plurality of gate structures may have high etch selectivity with respect to each other, and the recessing top portions of the plurality of gate structures may include selectively etching the top portions of the plurality of gate structures with respect to the first insulation layer.

The hardmask layer may have high etch selectivity with respect to the capping layer and the first insulation layer.

The capping layer may include SiN.

The first insulation layer may include oxide.

Each of the gate structures may further include a spacer formed to cover lateral surfaces of the conductive layer and the capping layer, in which the spacer may have high etch selectivity with respect to the first insulation layer.

The spacer may include low-k SiN.

The hardmask layer may include at least one of metal, metal oxide, metal nitride, hafnium oxide (HfO), polysilicon, silicon oxide, silicon nitride, polymer, polyimide, and spin on hardmask (SOH).

The block layer may include SiN.

The hardmask patterns may be formed along recesses which are formed on the plurality of gate structures.

A width of the hardmask pattern may be equal to a width of the capping layer.

A width of the hardmask pattern may be larger than a width of the capping layer.

The forming a first insulation layer between each of the plurality of gate structures may further comprise planarizing top portions of the plurality of gate structures and a top portion of the first insulation layer.

The capping layer may include a low-k material or an ultra-low-k material.

The low-k material may include SiBN, SiCN, SiBCN or SiOCN.

The ultra-low-k material may include black diamond (BD) or black diamond II (BDII).

The method for manufacturing a semiconductor device may further include: forming a layout for a contact pattern on the second insulation layer, and forming contact holes by removing the second insulation layer and the first insulation layer along the layout.

The first insulation layer and the hardmask pattern may have high etch selectivity with respect to each other, and the removing the first insulation layer may include selectively etching the first insulation layer with respect to the hardmask pattern.

The contact holes may be formed to self-align with the hardmask patterns and the gate structures.

The contact holes may include a first contact hole and a second contact hole spaced apart from the first contact hole, and the layout may include a first layout for forming the first contact hole and a second layout for forming the second contact hole.

The contact holes may include a first contact hole and a second contact hole spaced apart from the first contact hole, and the layout may include a single layout for forming the first contact hole and the second contact hole.

The forming of contact holes by removing the second insulation layer and the first insulation layer along the layout may include performing a wet chemical etch followed by a RIE over etch.

According to another aspect of the present inventive concept, there is provided a method for manufacturing a semiconductor device, the method including: forming a plurality of gate structures arranged in parallel on a substrate and being spaced apart from each other, each of the plurality of gate structures including a conductive layer and a capping layer formed on the conductive layer, and the capping layer including a low-k material or an ultra-low-k material; forming a first insulation layer between each of the plurality of gate structures; recessing top portions of the plurality of gate structures; forming a hardmask pattern having high etch selectivity with respect to the first insulation layer on each of the plurality of gate structures along recessed top surface of each of the plurality of gate structures, a width of the hardmask pattern being greater than or equal to a width of each of the plurality of gate structures; and forming contact holes between each of the plurality of gate structures using the hardmask patterns.

The first insulation layer and the capping layer of the plurality of gate structures may have high etch selectivity with respect to each other, and the recessing top portions of the plurality of gate structures may include selectively etching the top portions of the plurality of gate structures with respect to the first insulation layer.

The hardmask layer may have high etch selectivity with respect to the capping layer and the first insulation layer.

The forming a hardmask pattern may include: forming a block layer along a top surface of the first insulation layer and recessed top surfaces of the plurality of gate structures, forming a hardmask layer on the block layer, and forming the hardmask pattern on each of the plurality of gate structures by planarizing a top portion of the block layer and a top portion of the hardmask layer.

The hardmask layer may include at least one of metal, metal oxide, metal nitride, hafnium oxide (HfO), polysilicon, silicon oxide, silicon nitride, polymer, polyimide, and spin on hardmask (SOH).

The hardmask patterns may be formed along recesses which are formed on the plurality of gate structures.

A width of the hardmask pattern may be equal to a width of the capping layer.

A width of the hardmask pattern may be larger than a width of the capping layer.

The forming contact holes may include selectively etching the first insulation layer with respect to the hardmask pattern.

The contact holes may be formed to self-align with the hardmask patterns and the gate structures.

According to still another aspect of the present inventive concept, there is provided a method for manufacturing a semiconductor device, the method including: forming a plurality of gate structures arranged in parallel on a substrate and being spaced apart from each other, the substrate including a first region and a second region, each of the plurality of gate structures including a conductive layer and a capping layer formed on the conductive layer; forming a first insulation layer between each of the plurality of gate structures; recessing top portions of the plurality of gate structures; forming a first block layer having a first thickness in the first region and a second block layer having a second thickness different from the first thickness in the second region, along a top surface of the first insulation layer and recessed top surfaces of the plurality of gate structures; forming a hardmask layer on the first block layer and the second block layer; forming a hardmask pattern on each of the plurality of gate structures by planarizing top portions of the first block layer and the second block layer, and top portion of the hardmask layer; and forming a second insulation layer along top surfaces of the first block layer and the second block layer and a top surface of the hardmask pattern.

The hardmask pattern may include a first hardmask pattern formed on the first block layer in the first region and a second hardmask pattern formed on the second block layer in the second region, and the first hardmask pattern and the second hardmask pattern may have different widths from each other.

A thickness of the first block layer may be larger than a thickness of the second block layer and a width of the first hardmask pattern may be smaller than a width of the second hardmask pattern.

The contact holes may include a first contact hole between each of the plurality of gate structures in the first region and a second contact hole between each of the plurality of gate structures in the second region, and the first contact hole and the second contact hole may have different widths from each other.

A thickness of the first block layer may be larger than a thickness of the second block layer and a width of the first contact hole may be larger than a width of the second contact hole.

According to yet still another aspect of the present inventive concept, there is provided a method for manufacturing a semiconductor device, the method including: forming a plurality of gate structures arranged in parallel on a substrate and being spaced apart from each other, each of the plurality of gate structures including a conductive layer and a capping layer formed on the conductive layer; forming a spacer to cover lateral surfaces of the conductive layer and the capping layer; forming a first insulation layer between each of the plurality of gate structures; recessing top portions of the plurality of gate structures; forming a hardmask pattern along recessed top surface of each of the plurality of gate structures; forming a second insulation layer along top surface of the first insulation layer and top surface of the hardmask pattern; forming a layout for a contact pattern on the second insulation layer; and forming contact holes by removing the second insulation layer and the first insulation layer along the layout.

Before the forming of a hardmask pattern along recessed top surface of each of the plurality of gate structures further includes: forming a block layer along a top surface of the first insulation layer and recessed top portions of the plurality of gate structures.

The block layer includes SiN.

The hardmask pattern includes at least one of metal, metal oxide, metal nitride, hafnium oxide (HfO), polysilicon, silicon oxide, silicon nitride, polymer, polyimide, and spin on hardmask (SOH).

The spacer includes low-k SiN.

The capping layer includes a low-k material or an ultra-low-k material.

The low-k material includes SiBN, SiCN, SiBCN or SiOCN, and the ultra-low-k material includes black diamond (BD) or black diamond II (BDII).

The forming of the contact holes by removing the second insulation layer and the first insulation layer along the layout includes performing a wet chemical etch followed by a RIE over etch.

BRIEF DESCRIPTION OF THE DRAWINGS

The above and other features of the present inventive concept will become more apparent by the following detailed description of the preferred embodiments taken with reference to the accompanying drawings, and in which.

Figure 1:
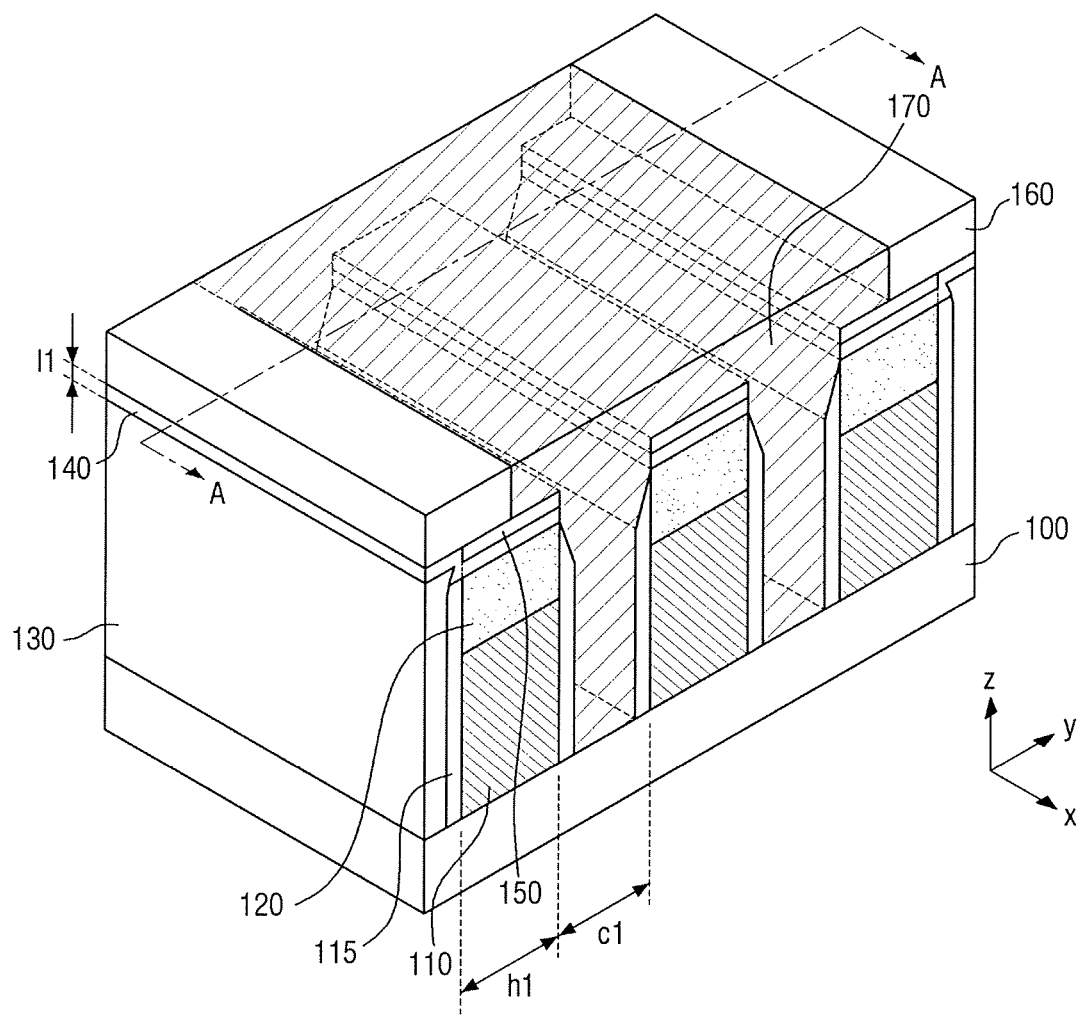
FIG. 1 is a perspective view of a semiconductor device according to an exemplary embodiment of the present inventive concept.

Since the drawings in FIGS. 1-25 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments will be described in detail with reference to the accompanying drawings. The inventive concept, however, may be embodied in various different forms, and should not be construed as being limited only to the specific illustrated exemplary embodiments. Rather, these embodiments are provided as examples so that this disclosure will be thorough and complete, and will fully convey the concept of the inventive concept to those skilled in the art. Accordingly, known processes, elements, and techniques are not described with respect to some of the exemplary embodiments of the inventive concept. Unless otherwise noted, like reference numerals denote like elements throughout the specification and the accompanying drawings, and thus descriptions will not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", "beneath" or "under" other elements or features would then be oriented "above" the other elements or features. Thus, the exemplary terms "below" and "under" can encompass both an orientation of above and below. The device may be oriented differently (for example, rotated 90 degrees or at other orientations) and the spatially relative descriptors used herein would then be interpreted accordingly. In addition, it will also be understood that when a layer is referred to as being "between" two layers, the layer may be the only layer between the two layers, or one or more intervening layers may also be present.

The terminology used herein is for the purpose of describing particular embodiments of the present inventive concept only and is not intended to be limiting of the inventive concept. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, components, and/or groups but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on", "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Features of the present inventive concept and methods of accomplishing the same may be understood more readily by reference to the following detailed description of the preferred embodiments and the accompanying drawings.

FIG. 1 is a perspective view of a semiconductor device according to an exemplary embodiment of the present inventive concept.

Referring to FIG. 1, the semiconductor device according to an exemplary embodiment of the present inventive concept includes a substrate 100, a plurality of gate structures 110 and 120, a first insulation layer 130, a block layer 140, a hardmask pattern 150 and a second insulation layer 160. In an exemplary embodiment of the present inventive concept, the semiconductor device may further include a contact 170.

The substrate 100 may include a silicon substrate or a silicon on insulator (SOI) substrate, but aspects of the present inventive concept are not limited thereto. The substrate 100 may include an active region and a device isolation region for defining the active region. In an exemplary embodiment of the present inventive concept, the device isolation region may be formed to have a shallow trench isolation (STI) structure.

The plurality of gate structures 110 and 120 are arranged in parallel on the substrate 100 and being spaced apart from each other. For example, the plurality of gate structures 110 and 120 extend in a first direction x, and are spaced apart from each other in a second direction y and arranged in parallel. Each of the gate structures 110 and 120 includes a conductive layer 110 and a capping layer 120 formed on the conductive layer 110.

The conductive layer 110 extends in the first direction x to form gate lines. Here, the conductive layer 110 may include polysilicon or metal. In an exemplary embodiment of the present inventive concept, the conductive layer 110 may further include a silicide layer.

The capping layer 120 extends in the first direction x to cover the conductive layer 110. The capping layer 120 may serve to protect the conductive layer 110 during the semiconductor device manufacturing process and to establish insulation between the conductive layer 110 and another semiconductor layer. For example, the capping layer 120 may serve as a chemical mechanical polishing (CMP) ending layer in a process for forming a self-aligned contact. In an exemplary embodiment of the present inventive concept, the capping layer 120 may include SiN, but aspects of the present inventive concept are not limited thereto.

According to the purpose of the inventive concept to be implemented, each of the gate structures 110 and 120 may further include an interface layer, a gate insulation layer, and a work function control layer.

In an exemplary embodiment of the present inventive concept, each of the gate structures 110 and 120 may further include a spacer 115 covering lateral surfaces of the conductive layer 110 and the capping layer 120. The spacer 115 may protect lateral surfaces of the gate structures 110 and 120, for example, during the process for forming the self-aligned contact. In an exemplary embodiment of the present inventive concept, the spacer 115 may include at least one of nitride, oxynitride and a low-k material. Specifically, the spacer 115 may include low-k SiN, but aspects of the present inventive concept are not limited thereto. The low-k SiN may include other element(s) besides Si and N. Materials that may be used for the spacer 115 may include, for example, SiBN, SiCN, SiOCN or SiBCN. In addition, unlike in FIG. 1, the spacer 115 may be formed to have an I-letter shape or an L-letter shape and may include multiple layers. The spacer 115 may have high etch selectivity with respect to the first insulation layer 130. For example, the spacer 115 is etched at a much lower rate than the first insulation layer 130 is etched at identical plasma conditions. The first insulation layer 130 can then be selectively etched without etching the spacer 115 under one etch condition.

The first insulation layer 130 is formed between each of the plurality of gate structures 110 and 120. The first insulation layer 130 establishes insulation between each of the gate structures 110 and 120 and may include oxide. Here, the first insulation layer 130 has high etch selectivity with respect to the capping layer 120. Accordingly, in the process for forming the self-aligned contact, the capping layer 120 may be selectively etched with respect to the first insulation layer 130.

The block layer 140 is formed along top surfaces of the first insulation layer 130 and the plurality of gate structures 110 and 120. Here, top portions of the plurality of gate structures 110 and 120, that is, top portions of the capping layers 120, are recessed by the method for manufacturing a semiconductor device, which will be described later (see FIG. 15). Preferably, the block layer 140 is conformally formed along the top surface of the first insulation layer 130 and the recessed top surfaces of the plurality of gate structures 110 and 120, so that it includes recessed portions positioned to correspond to the recessed top surfaces of the plurality of gate structures 110 and 120 recessed in a third direction z. In an exemplary embodiment of the present inventive concept, the block layer 140 may include SiN, but aspects of the present inventive concept are not limited thereto.

The hardmask pattern 150 is formed on the block layer 140. In detail, the hardmask patterns 150 are formed in the recessed portions of the block layer 140 positioned on the top surfaces of the plurality of gate structures 110 and 120 recessed in the third direction z. In other words, the hardmask patterns 150 are formed along recesses formed on the top portions of the plurality of gate structures 110 and 120.

The hardmask patterns 150 may include materials having high etch selectivity with respect to silicon nitride (e.g., SiN) and oxide. For example, the hardmask patterns 150 may have high etch selectivity with respect to the capping layer 120, the block layer 140 and the first insulation layer 130. In an exemplary embodiment of the present inventive concept, a width h1 of the hardmask pattern 150 may be equal to a width of the capping layer 120 or the conductive layer 110.

In an exemplary embodiment of the present inventive concept, the hardmask patterns 150 may include at least one selected from the group consisting of metal, metal oxide, metal nitride, hafnium oxide (HfO), polysilicon, silicon oxide, silicon nitride, polymer, polyimide, and spin on hardmask (SOH). However, the present inventive concept does not limit the materials of the hardmask patterns 150 to the above described materials, so long as they have high etch selectivity with respect to silicon nitride (e.g., SiN) and oxide.

The second insulation layer 160 includes oxide. As will be described later, the second insulation layer 160 may establish insulation from another semiconductor pattern to form a contact at a desired position.

As described above, the capping layer 120 protects the conductive layer 110. However, in a case where an etching process is performed to form the contact 170, since etch selectivity between silicon nitride (e.g., SiN) and oxide is not so high, a considerable amount of the capping layer 120 may be lost. If the loss of the capping layer 120 is large, there is a risk of a short circuit occurring between the conductive layer 110 and the contact 170. In addition, in an event of processing misalignment, a sufficient margin may not be secured, resulting in an abnormal structure.

To avoid the risk of a short circuit between the conductive layer 110 and the contact 170, the hardmask patterns 150 according to an exemplary embodiment of the present inventive concept are formed on each of the gate structures 110 and 120, thereby securely protecting the gate structures 110 and 120, specifically, the conductive layer 110, during the semiconductor device manufacturing process. That is to say, the hardmask patterns 150 can perfectly protect the conductive layer 110 in the etching process for forming the contact 170, and a sufficient margin for forming the self-aligned contact can be secured. In addition, in the method for manufacturing the semiconductor device using the hardmask patterns 150 according to an exemplary embodiment of the present inventive concept, the self-aligned contact can be formed around the gate structures 110 and 120.

Figure 2:
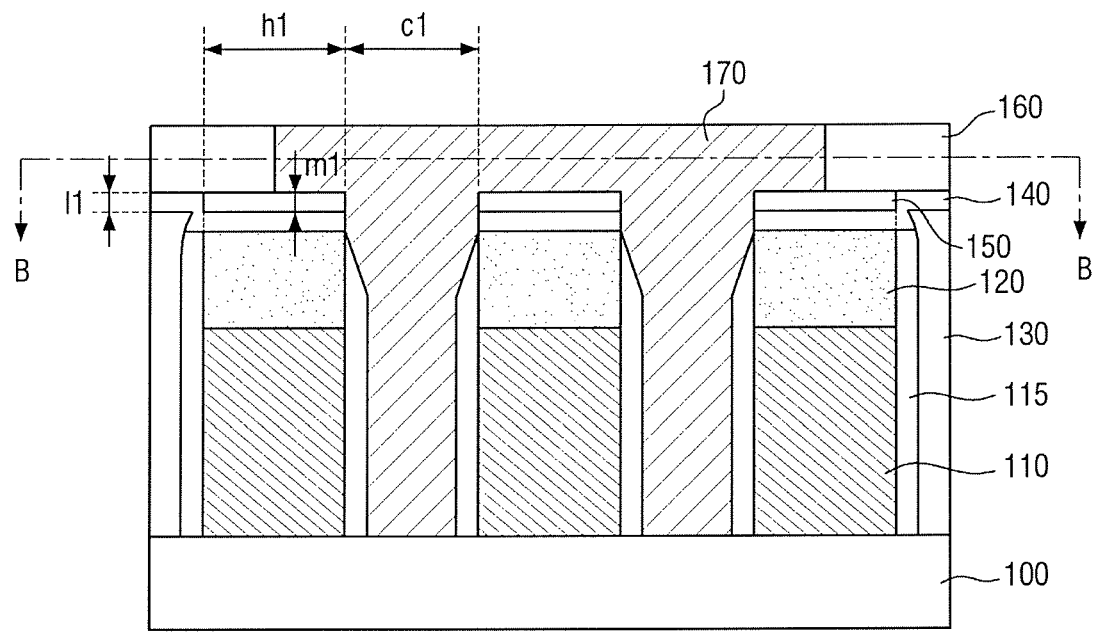
FIG. 2 is a cross-sectional view taken along the line A-A of FIG. 1 according to an exemplary embodiment of the present inventive concept.
Figure 3:
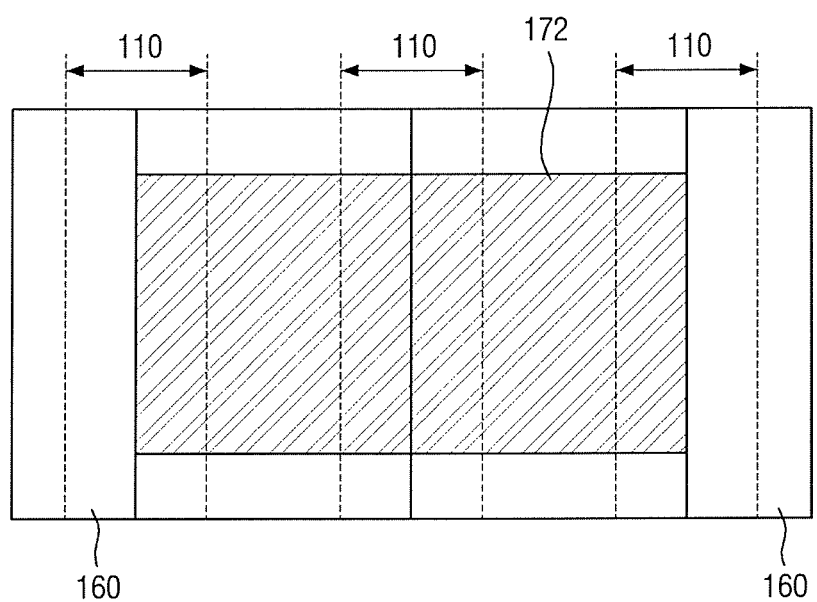
FIG. 3 is a cross-sectional view taken along the line B-B of FIG. 2 according to an exemplary embodiment of the present inventive concept.

FIG. 2 is a cross-sectional view taken along the line A-A of FIG. 1 and FIG. 3 is a cross-sectional view taken along the line B-B of FIG. 2.

Referring to FIG. 2, to form the contact 170, a layout may be included in a process for removing a portion of the second insulation layer 160 and the first insulation layer 130 corresponding to a region where the contact 170 is to be formed. The layout may be a single layout and may be used for forming a plurality of contact holes. In detail, to form the contact holes, a layout for a contact pattern is formed on the second insulation layer 160, and the second insulation layer 160 and the first insulation layer 130 may be removed along the layout. The layout may be formed with a lithographic process. A photoresist layer is formed on the second insulating layer 160 through a process including a spin coating step and a baking step. Either positive or negative photoresist may be used. The photoresist layer is first exposed with a radiation through a photomask which contains the layout pattern, and is then processed with a typical photoresist process, such as baking and then developing with a developer, to form a patterned photoresist layer containing the layout. The layout may be an opening in the photoresist pattern for etching the second insulation layer 160 and the first insulation layer 130. The layout may be transferred to the second insulation layer 160 through etching. The lithographic patterning process may include silicon containing interlayer and carbon rich organic underlayer in addition to the photoresist layer. The lithographic process may also include extra etching steps to etch the silicon containing interlayer and the organic underlayer. After etching the second insulation layer 160 and the first insulation layer 130, the lithographic materials may be stripped or ashed.

As shown in FIG. 2, when the contact holes to be formed include a left contact hole (i.e., a first contact hole) and a right contact hole (i.e., a second contact hole), the second insulation layer 160 and the first insulation layer 130 may be removed using only a single layout 172 shown in FIG. 3. FIG. 3 is a cross-sectional view taken along the line B-B of FIG. 2. The view shows the single layout 172 in the second insulation layer 160. When necessary, the contact 170 formed in the first contact hole and the second contact hole using the single layout 172 may be separated into individual contacts through, for example, planarization, in a subsequent process. The contact 170 may be formed to include more than two contact holes using the single layout 172.

The above-described process is enabled because the hardmask patterns 150 according to an exemplary embodiment of the present inventive concept can securely protect the gate structures 110 and 120, specifically, the conductive layers 110, during the semiconductor device manufacturing process, thereby reducing the manufacturing cost.

In an exemplary embodiment of the present inventive concept, the hardmask patterns 150 and the block layer 140 may be formed on the plurality of the gate structures 110 and 120 to protect the gate structures 110 and 120, and a reactive ion etching (RIE) process may be used to remove the second insulation layer 160 and the first insulation layer 130 to form the contact 170 with RIE over etch to ensure contact open. The combination of the hardmask patterns 150, spacer 115 (higher spacer height) and the block layer 140 may provide sufficient masking and may allow an over etch to carry out without the worry of a short circuit occurring between the conductive layer 110 and the contact 170. The RIE over etch may include higher etching power, larger etchant concentration, fast flow rate, and/or longer etching time during etching process, for example, these parameters may be at least 20%, 30%, or 50% more than regular etching process. An oxide wet etch followed by a dry etch (RIB) process for obtaining better (not small) contact CD at the bottom may also be used to etch the second insulation layer 160 and the first insulation layer 130, because top block layer 140 prevents the interlayer dielectric (ILD) oxide being etched during the wet etch process. The combination of wet etch with RIE dry etch may also provide better spacer shoulder margin. Many wet etch processes may be used, for example, the substrate containing the above structures may be treated with an oxide removal agent which includes hydrogen fluoride in an aqueous solution in a range of approximately 5:1 to 20,000:1 (water:hydrogen fluoride).

Figure 4:
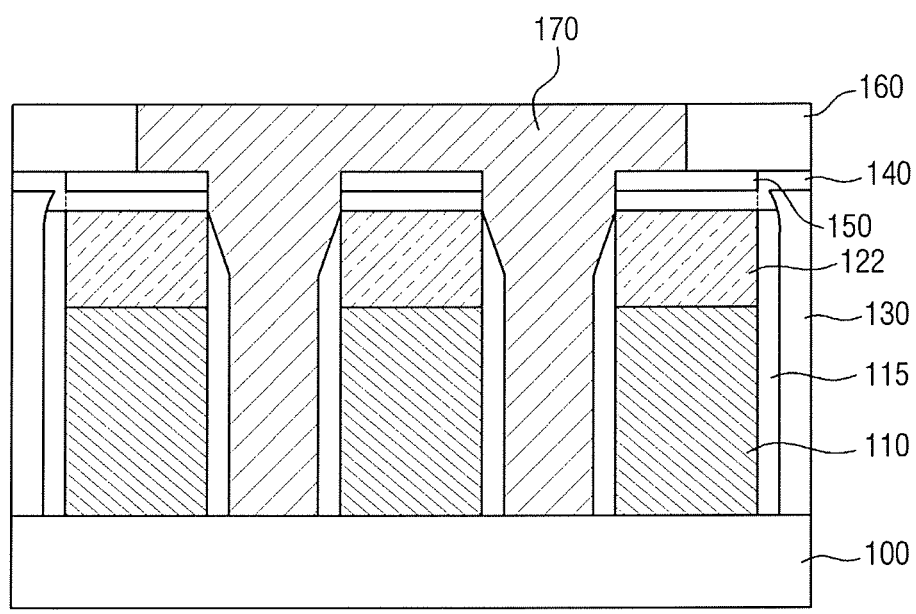
FIG. 4 is a cross-sectional view of a semiconductor device with a different material in the capping layer according to an exemplary embodiment of the present inventive concept.

FIG. 4 is a cross-sectional view of a semiconductor device according to an exemplary embodiment of the present inventive concept.

Referring to FIG. 4, the semiconductor device according to the present embodiment is different from the semiconductor device according to the previous embodiment in view of a material of a capping layer 122.

Since the hardmask patterns 150 according to an exemplary embodiment of the present inventive concept can securely protect the gate structures 110 and 120, specifically, the conductive layer 110, during the semiconductor device manufacturing process, the function of the capping layer 120 protecting the conductive layer 110 may be less or not needed. Accordingly, in the present embodiment, the capping layer 122 including a low-k material or an ultra-low k material having excellent characteristics may be used without an aspect of protecting the conductive layer 110 with the capping layer 122. In an exemplary embodiment of the present inventive concept, the low-k material may include SiBN, SiCN, SiBCN or SiOCN and the ultra-low k material may include black diamond (BD) or black diamond II (BDII), but aspects of the present inventive concept are not limited thereto.

Figure 5:
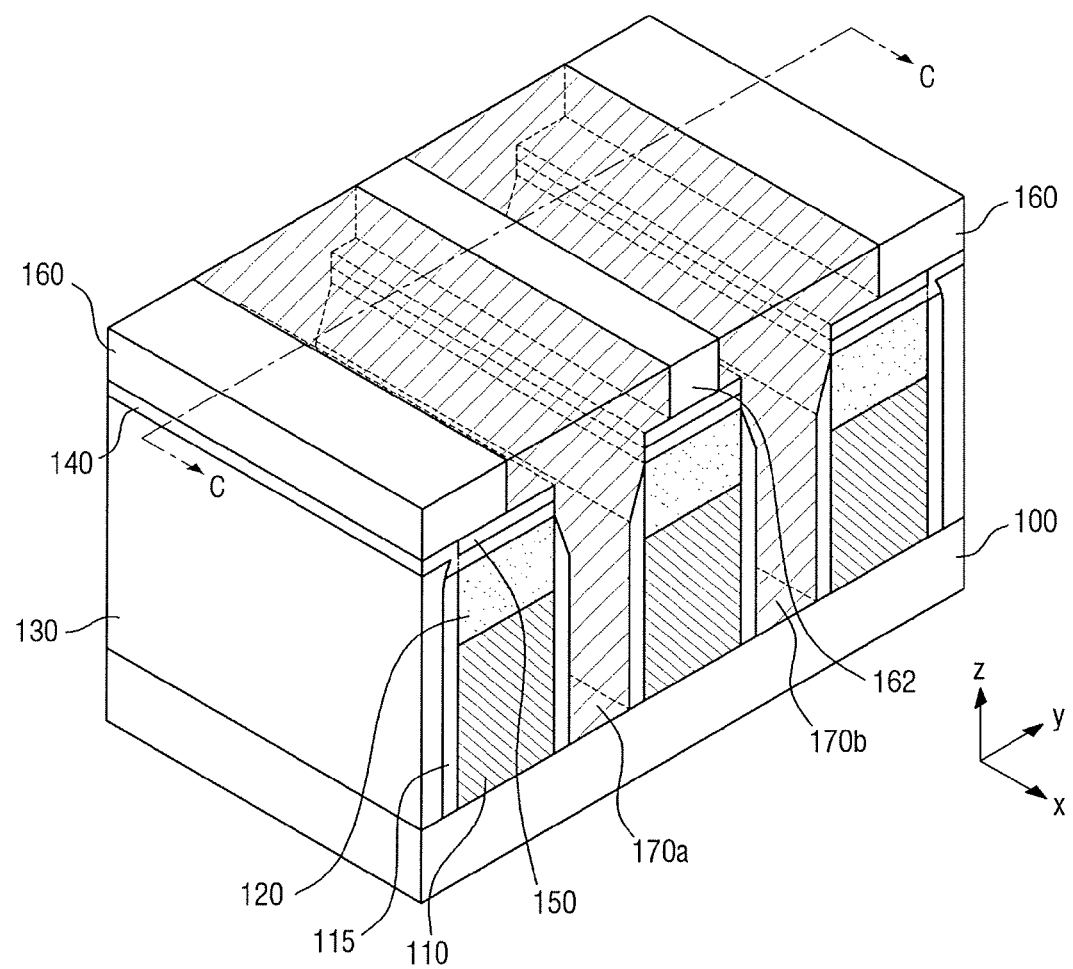
FIG. 5 is a perspective view of a semiconductor device using a plurality of layouts for forming a plurality of contact holes according to an exemplary embodiment of the present inventive concept.
Figure 6:
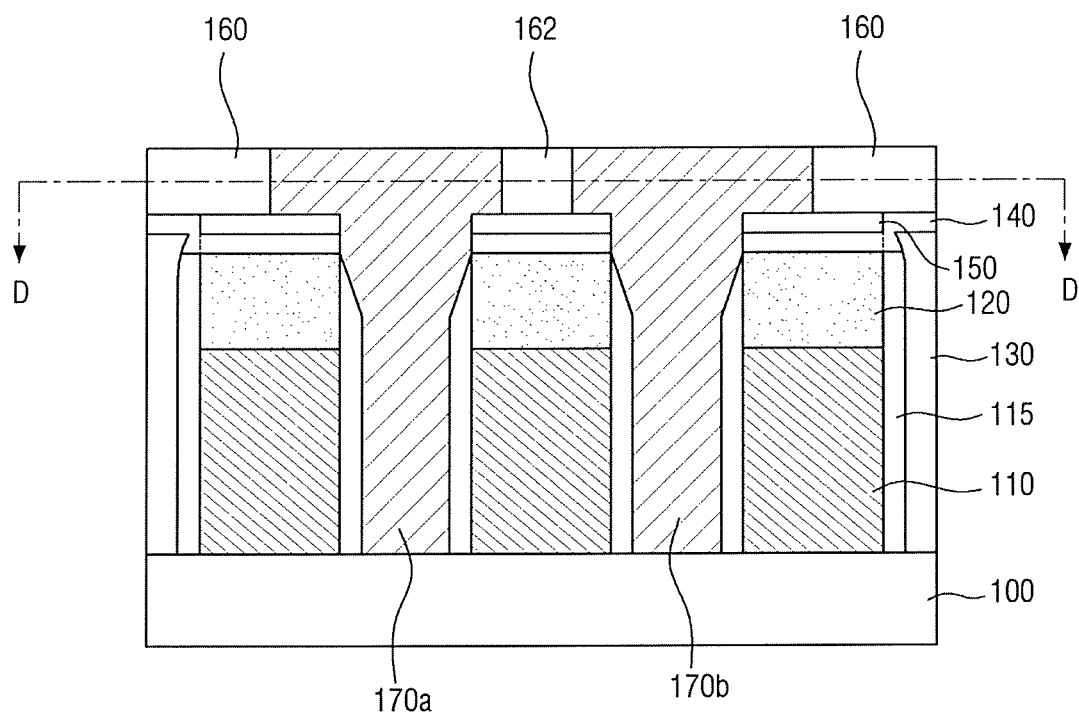
FIG. 6 is a cross-sectional view taken along the line C-C of FIG. 5 according to an exemplary embodiment of the present inventive concept.
Figure 7:
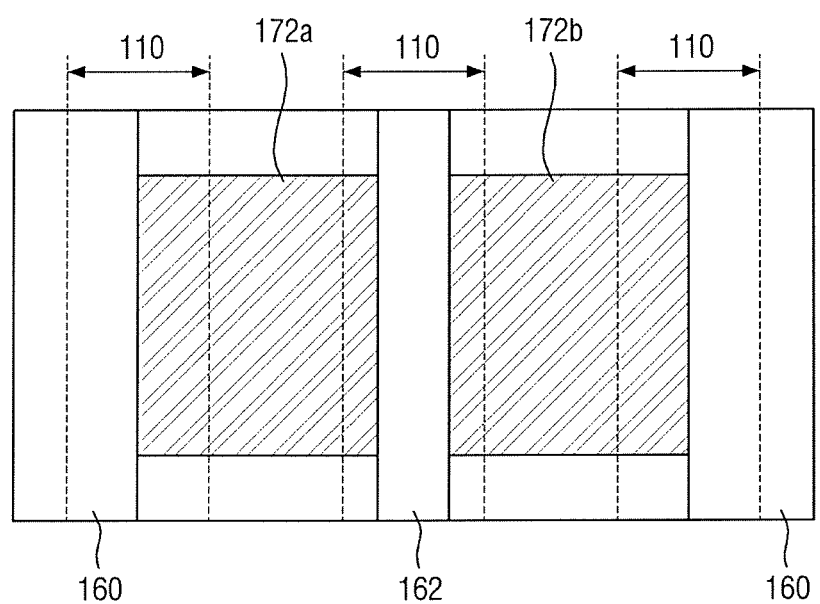
FIG. 7 is a cross-sectional view taken along the line D-D of FIG. 5 according to an exemplary embodiment of the present inventive concept.

FIG. 5 is a perspective view of a semiconductor device according to an exemplary embodiment of the present inventive concept, FIG. 6 is a cross-sectional view taken along the line C-C of FIG. 5, and FIG. 7 is a cross-sectional view taken along the line D-D of FIG. 5.

Referring to FIGS. 5 to 7, the present embodiment is different from the previous embodiment shown in FIGS. 1 to 3 in that a plurality of layouts 172*a* and 172*b* shown in FIG. 7 are used for forming a plurality of contact holes in a process of removing a portion of a second insulation layer 160 for forming contacts 170*a* and 170*b* and a first insulation layer 130 positioned at potential regions of the contacts 170*a* and 170*b*. As described above, to form the contact holes, a layout for a contact pattern is formed on the second insulation layer 160, and the second insulation layer 160 and the first insulation layer 130 may be removed along the layout. As described above, the layout(s) may be formed with a lithographic process.

As shown in FIG. 6, when the contact holes to be formed include a left contact hole (i.e., a first contact hole) and a right contact hole (i.e., a second contact hole), the second insulation layer 160 and the first insulation layer 130 may be removed using a plurality of layouts 172*a* and 172*b* shown in FIG. 7. The contacts 170*a* and 170*b* corresponding to the layouts 172*a* and 172*b* may be formed in a subsequent process.

Figure 8:
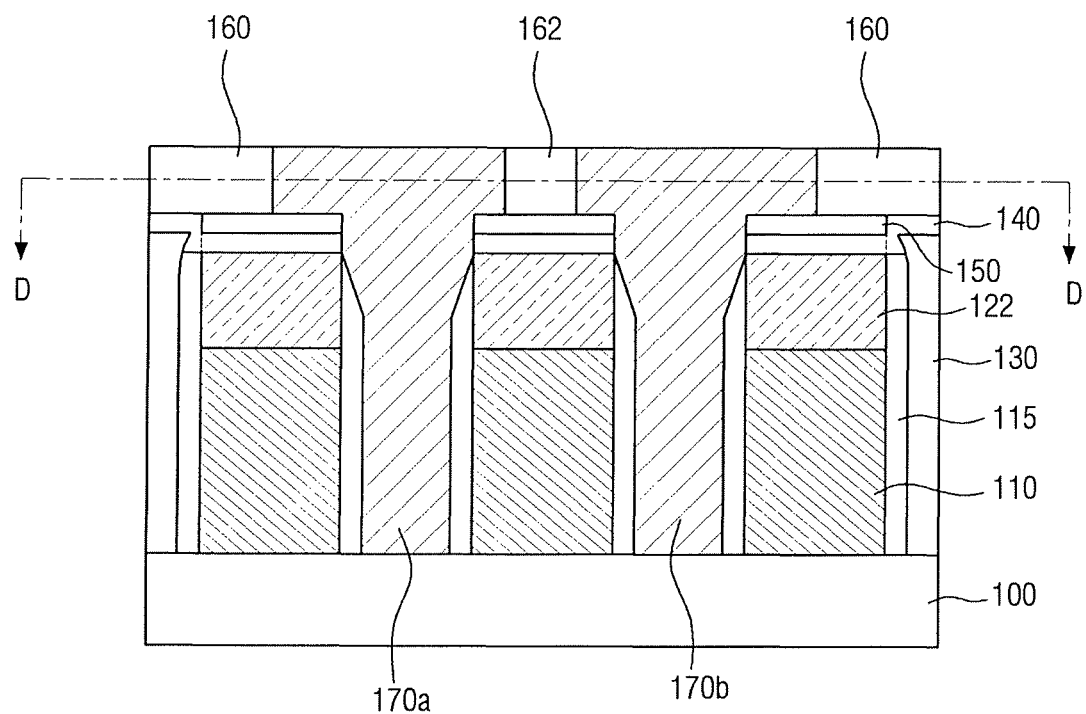
FIG. 8 is a cross-sectional view of a semiconductor device with a different material in the capping layer according to an exemplary embodiment of the present inventive concept.

FIG. 8 is a cross-sectional view of a semiconductor device according to an exemplary embodiment of the present inventive concept.

Referring to FIG. 8, the semiconductor device according to the present embodiment is different from the semiconductor device according to the previous embodiment in view of a material of a capping layer 122.

Since the hardmask patterns 150 according to an exemplary embodiment of the present inventive concept can securely protect the gate structures 110 and 120, specifically, the conductive layers 110, during the semiconductor device manufacturing process, the function of the capping layer 120 protecting the conductive layer 110 may be less or not needed. Accordingly, in the present embodiment, the capping layer 122 including a low-k material or an ultra-low k material having excellent characteristics may be used without an aspect of protecting the conductive layer 110 with the capping layer 122. In an exemplary embodiment of the present inventive concept, the low-k material may include SiBN, SiCN, SiBCN or SiOCN and the ultra-low k material may include black diamond (BD) or black diamond II (BDII), but aspects of the present inventive concept are not limited thereto.

Figure 9:
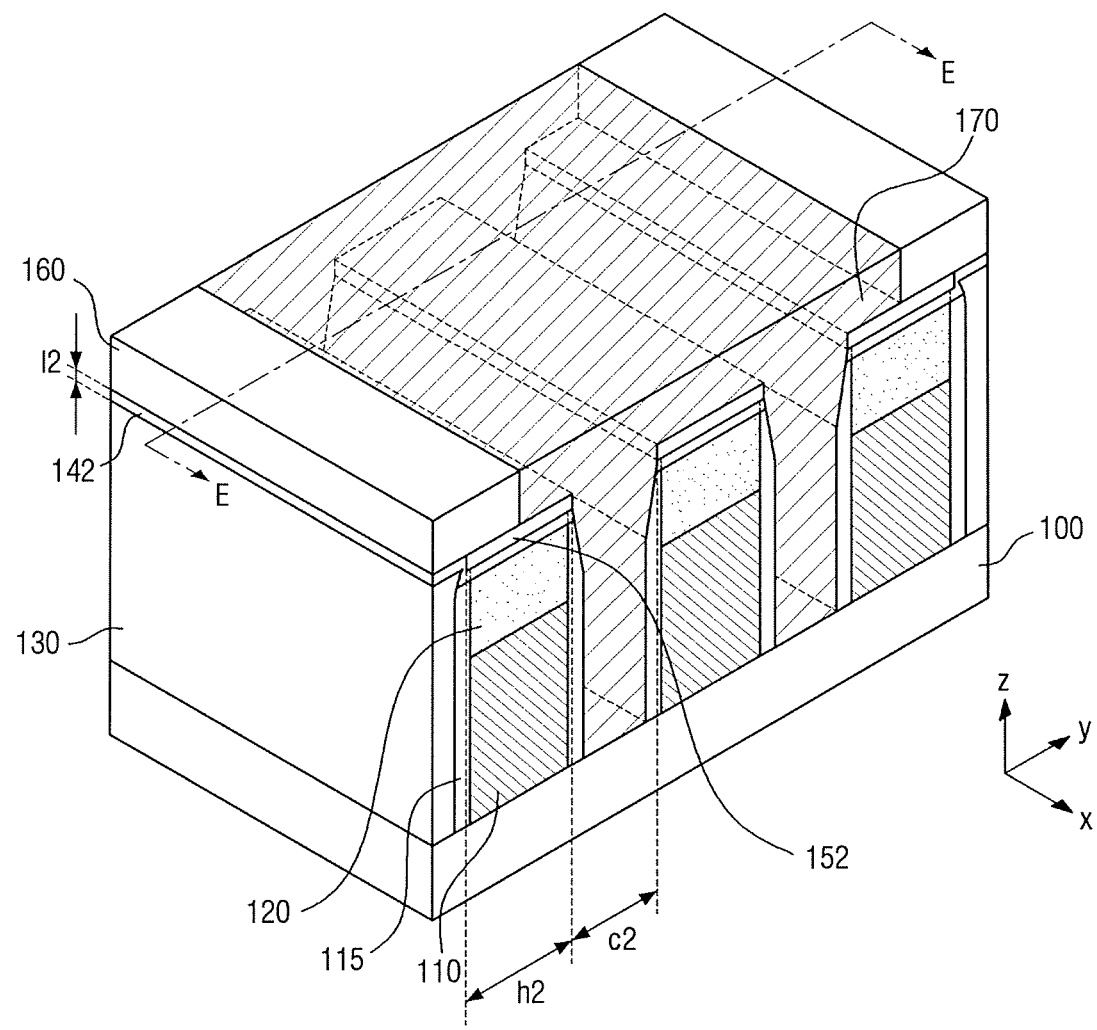
FIG. 9 is a perspective view of a semiconductor device having a width of a hardmask pattern is larger than that of the hardmask pattern shown in FIG. 1 according to an exemplary embodiment of the present inventive concept.
Figure 10:
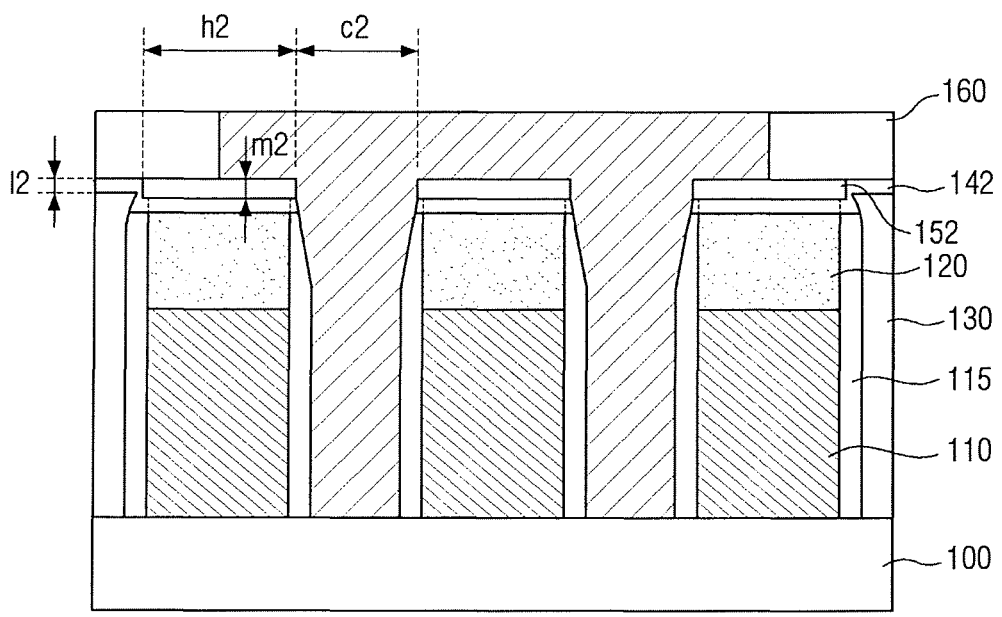
FIG. 10 is a cross-sectional view taken along the line E-E of FIG. 9 according to an exemplary embodiment of the present inventive concept.

FIG. 9 is a perspective view of a semiconductor device according to an exemplary embodiment of the present inventive concept and FIG. 10 is a cross-sectional view taken along the line E-E of FIG. 9.

Referring to FIGS. 9 and 10, the semiconductor device according to the present embodiment is different from the semiconductor device according to the previous embodiment shown in FIG. 1 in that a width h2 of a hardmask pattern 152 according to the present embodiment is larger than the width h1 of the hardmask pattern 150 shown in FIG. 1. In addition, a thickness t2 of a block layer 142 and a distance c2 between adjacent hardmask patterns 152 within the contacts 170 according to the present embodiment are respectively smaller than a thickness t1 of the block layer 140 and a distance c1 between adjacent hardmask patterns 150 within the contacts 170 according to the previous embodiment shown in FIG. 1.

In the method for manufacturing a semiconductor device according to an exemplary embodiment of the present inventive concept, which will later be described in detail with reference to FIGS. 13 to 22, a width of the hardmask pattern 150 and widths of top portions of the contacts 170 can be adjusted just by adjusting a thickness of the block layer 140.

According to the purpose of the inventive concept to be implemented, a first region and a second region are defined on a substrate and the contacts 170 having top portions of different widths may be formed on the respective regions. In detail, a first block layer having a first thickness is formed in the first region and a second block layer having a second thickness is formed in the second region. Then, a hardmask layer is formed on the first block layer and the second block layer and then planarized, thereby forming hardmask patterns having different widths in the respective regions.

When the thickness of the first block layer is larger than that of the second block layer, a width of the hardmask pattern formed in the first region is smaller than that of the hardmask pattern formed in the second region. Accordingly, a width of a top portion of the contact between adjacent hardmask patterns formed in the first region is larger than that of a top portion of the contact between adjacent hardmask patterns formed in the second region. That is to say, in the method for manufacturing the semiconductor device according to an exemplary embodiment of the present inventive concept, a contact pattern of a desired size can be easily formed just by adjusting a thickness of the block layer 140.

In an exemplary embodiment of the present inventive concept, to form the contacts 170, a layout may be included in a process for removing a portion of the second insulation layer 160 and the first insulation layer 130 corresponding to a region where the contacts 170 are to be formed, and the layout may be used for forming a plurality of contact holes. The layout may include a single layout. In detail, to form the contact holes, a layout for a contact pattern is formed on the second insulation layer 160, and the second insulation layer 160 and the first insulation layer 130 may be removed along the layout. The layout may be formed with a lithographic process.

As shown in FIG. 10, when the contact holes to be formed include a left contact hole (i.e., a first contact hole) and a right contact hole (i.e., a second contact hole), the second insulation layer 160 and the first insulation layer 130 may be removed using only a single layout shown in FIG. 3. When necessary, the contacts 170 formed in the first contact hole and the second contact hole using the single layout may be separated into individual contacts through, for example, planarization, in a subsequent process.

Figure 11:
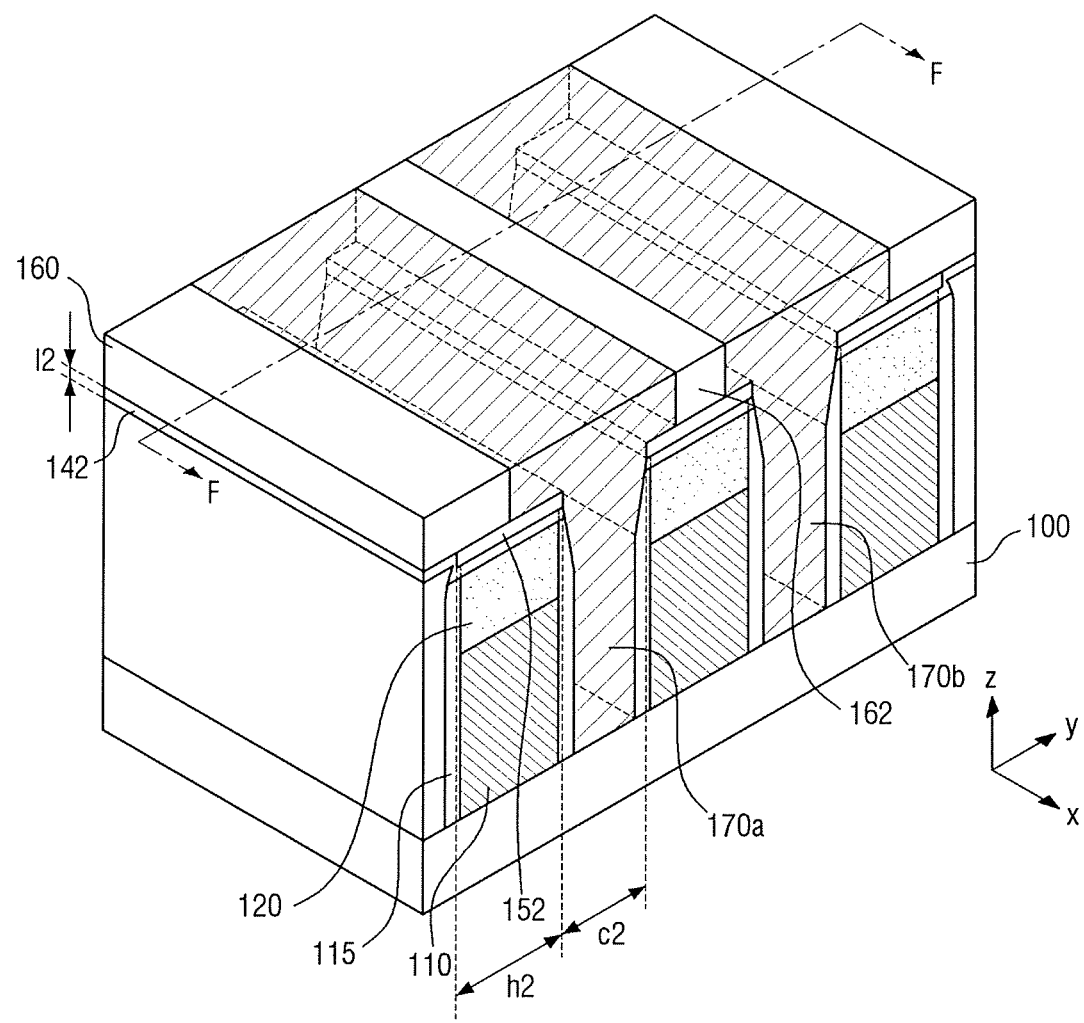
FIG. 11 is a perspective view of a semiconductor device of FIG. 9 using a plurality of layouts for forming a plurality of contact holes according to an exemplary embodiment of the present inventive concept.
Figure 12:
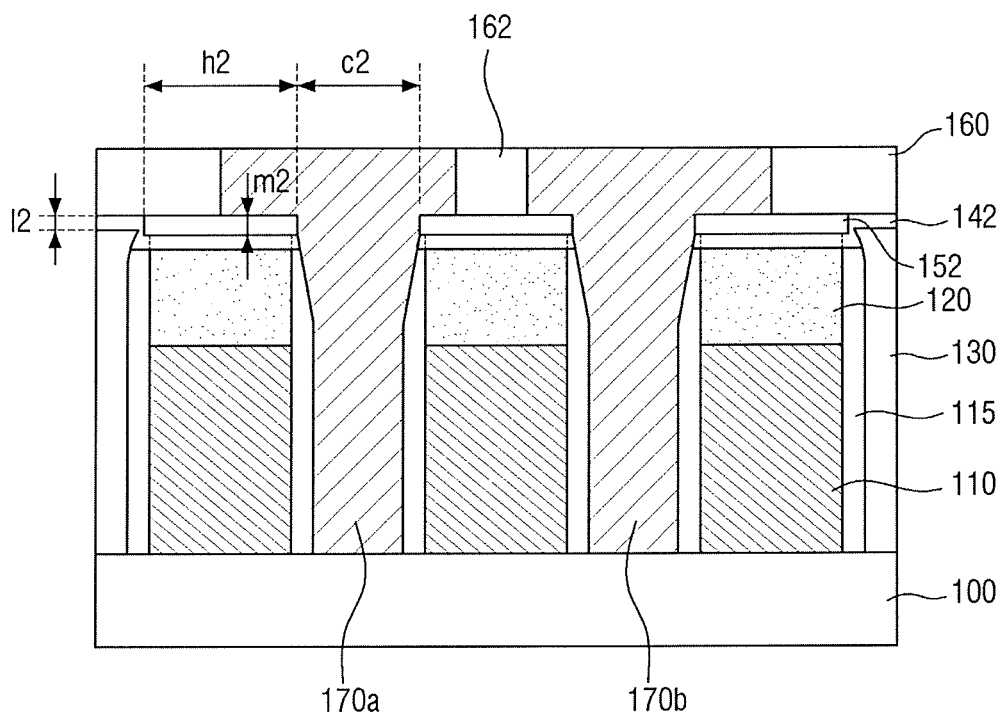
FIG. 12 is a cross-sectional view taken along the line F-F of FIG. 11 according to an exemplary embodiment of the present inventive concept.

FIG. 11 is a perspective view of a semiconductor device according to an exemplary embodiment of the present inventive concept and FIG. 12 is a cross-sectional view taken along the line F-F of FIG. 11.

Referring to FIGS. 11 and 12, the present embodiment is different from the previous embodiment shown in FIGS. 9 and 10 in that a plurality of layouts are used for forming a plurality of contact holes in a process of removing a portion of a second insulation layer 160 for forming contacts 170a and 170b, and a first insulation layer 130 positioned at potential regions of the contacts 170a and 170b. As described above, to forming the contact holes, a layout for a contact pattern is formed on the second insulation layer 160, and the second insulation layer 160 and the first insulation layer 130 may be removed along the layout. As described above, the layout(s) may be formed with a lithographic process.

As shown in FIG. 12, when the contact holes to be formed include a left contact hole (i.e., a first contact hole) and a right contact hole (i.e., a second contact hole), the second insulation layer 160 and the first insulation layer 130 may be removed using a plurality of layouts 172a and 172b shown in FIG. 7. The contacts 170a and 170b corresponding to the layouts 172a and 172b may be formed in a subsequent process.

FIGS. 13 to 21 illustrate a fabricating method of a semiconductor device according to an exemplary embodiment of the present inventive concept.

Figure 13:
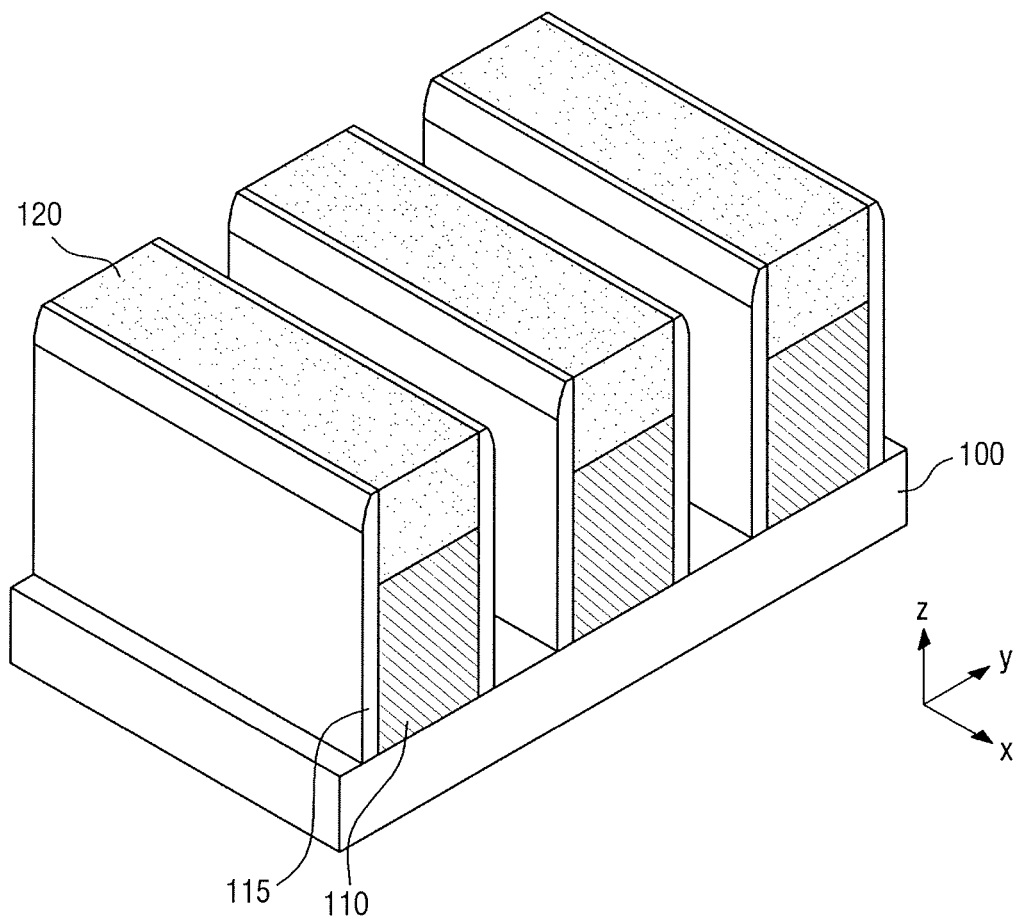
FIGS. 13 to 21 illustrate a fabricating method of a semiconductor device according to an exemplary embodiment of the present inventive concept.

Referring to FIG. 13, a plurality of gate structures 110 and 120 spaced apart from each other and arranged in parallel are formed on a substrate 100. In an exemplary embodiment of the present inventive concept, each of the gate structures 110 and 120 includes a conductive layer 110 and a capping layer 120 formed on the conductive layer 110. The formation of the gate structures 110 and 120 may include deposition process and patterning process. Various deposition processes may be used which include, but are not limited to: physical vapor deposition (PVD), chemical vapor deposition (CVD), atomic layer deposition (ALD), electrochemical deposition (ECD), electroplating, electroless plating and spin coating. The patterning process may include lithographic process and etching process.

In an exemplary embodiment of the present inventive concept, each of the gate structures 110 and 120 may further include a spacer 115 formed to cover lateral surfaces of the conductive layer 110 and the capping layer 120. The spacer 115 may include low-k SiN, for example, SiBN, SiCN, SiBCN or SiOCN.

Figure 14:
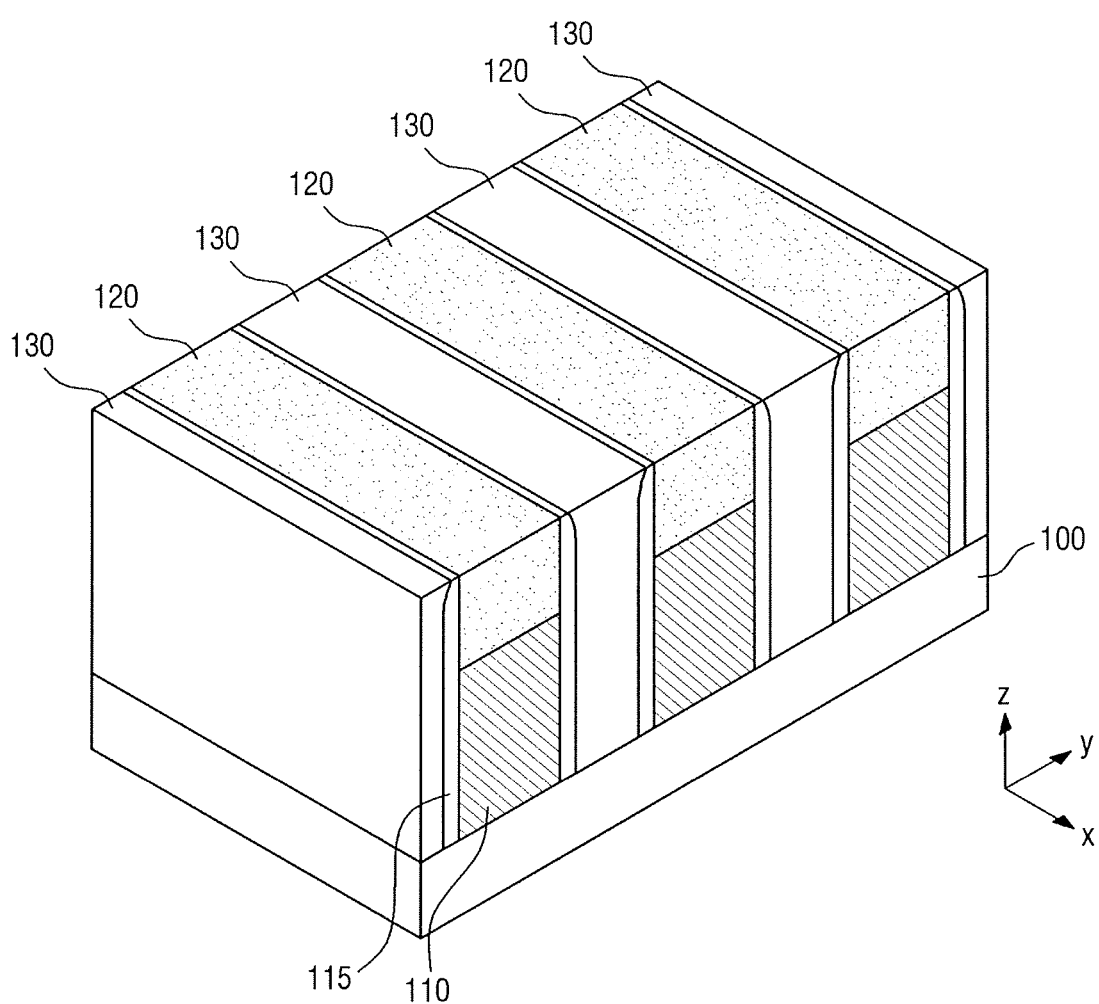

Referring to FIG. 14, a first insulation layer 130 is formed between each of the plurality of gate structures 110 and 120. When necessary, top portions of the plurality of gate structures 110 and 120 and a top portion of the first insulation layer 130 may be planarized. The first insulation layer 130 may be silicon oxide or other suitable material. For silicon oxide, it may be deposited with typical oxide deposition techniques, for example, high-density plasma chemical vapor deposition (HDPCVD) or atmospheric pressure chemical vapor deposition (APCVD), and may then be planarized with CMP to remove the oxide atop of the capping layer 120.

Figure 15:
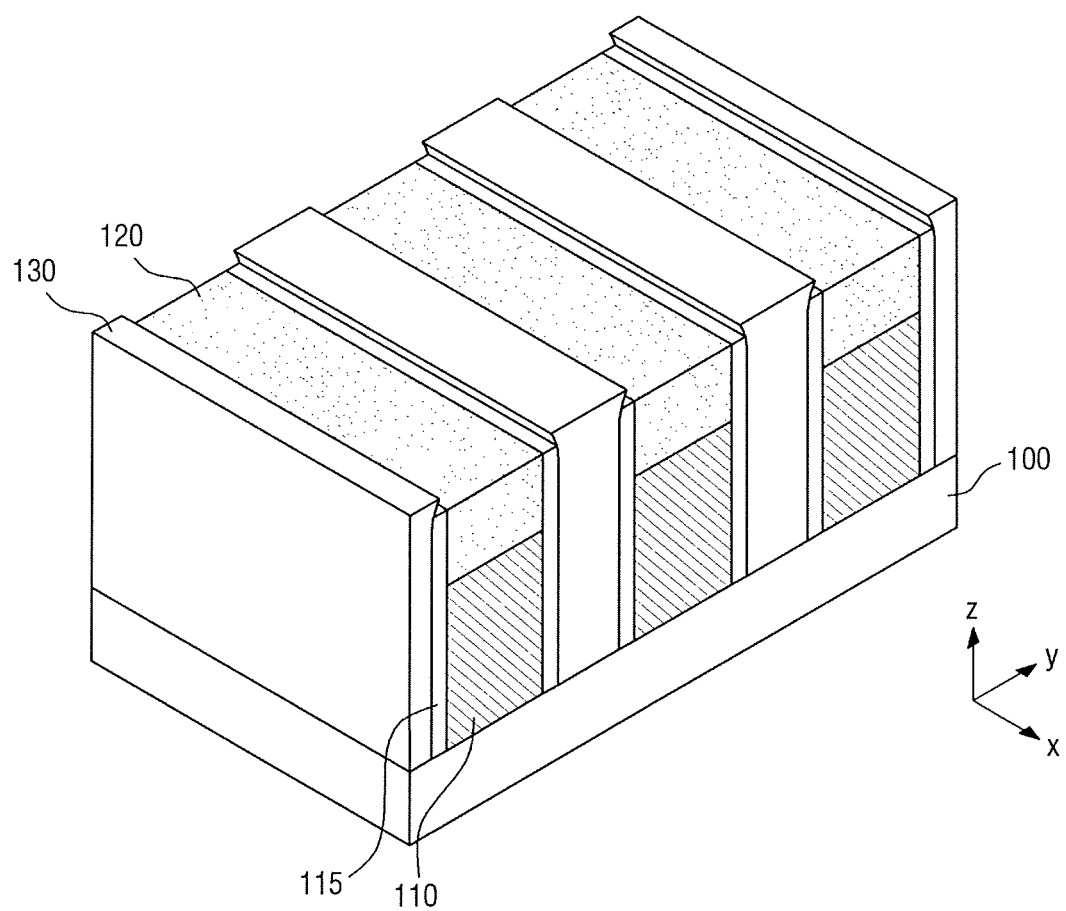

Referring to FIG. 15, the top portions of the plurality of gate structures 110 and 120 are recessed. Here, since the first insulation layer 130 and the capping layer 120 have high etch selectivity with respect to each other, the top portions of the plurality of gate structures 110 and 120 may be selectively etched with respect to the first insulation layer 130 to recess the top portions of the plurality of gate structures 110 and 120. On the other hand, since the first insulation layer 130 and the capping layer 120 have high etch selectivity with respect to each other, by properly choosing a different etching condition, the first insulation layer 130 may be selectively etched with respect to the capping layer 120. For example, the first insulation layer 130 may include silicon oxide, while the capping layer 120 may include silicon nitride or low-k SiN. The low-k silicon nitride may include SiBN, SiCN, SiBCN or SiOCN. For selectively etching silicon nitride, a dry etch RIE process may contain an etch step with etchants including one or both of NH3 and SF6, in combination with HBr and N2.

Figure 16:
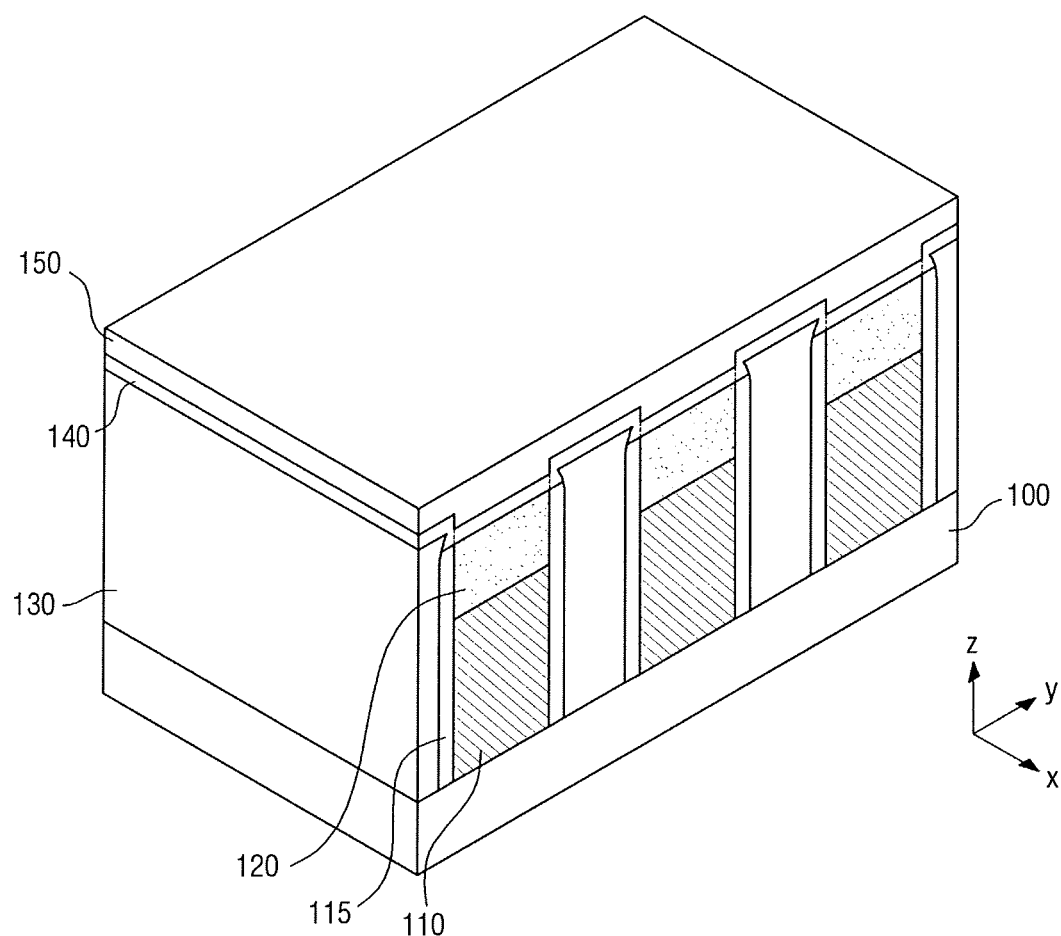

Referring to FIG. 16, a block layer 140 is first formed along a top surface of the first insulation layer 130 and recessed top surfaces of the plurality of gate structures 110 and 120. The block layer 140 may include silicon nitride or other suitable material, and may be uniformly and conformally deposited on the top surfaces and sidewalls of the recesses. Thereafter, a hardmask layer 150 is formed on the block layer 140.

Figure 17:
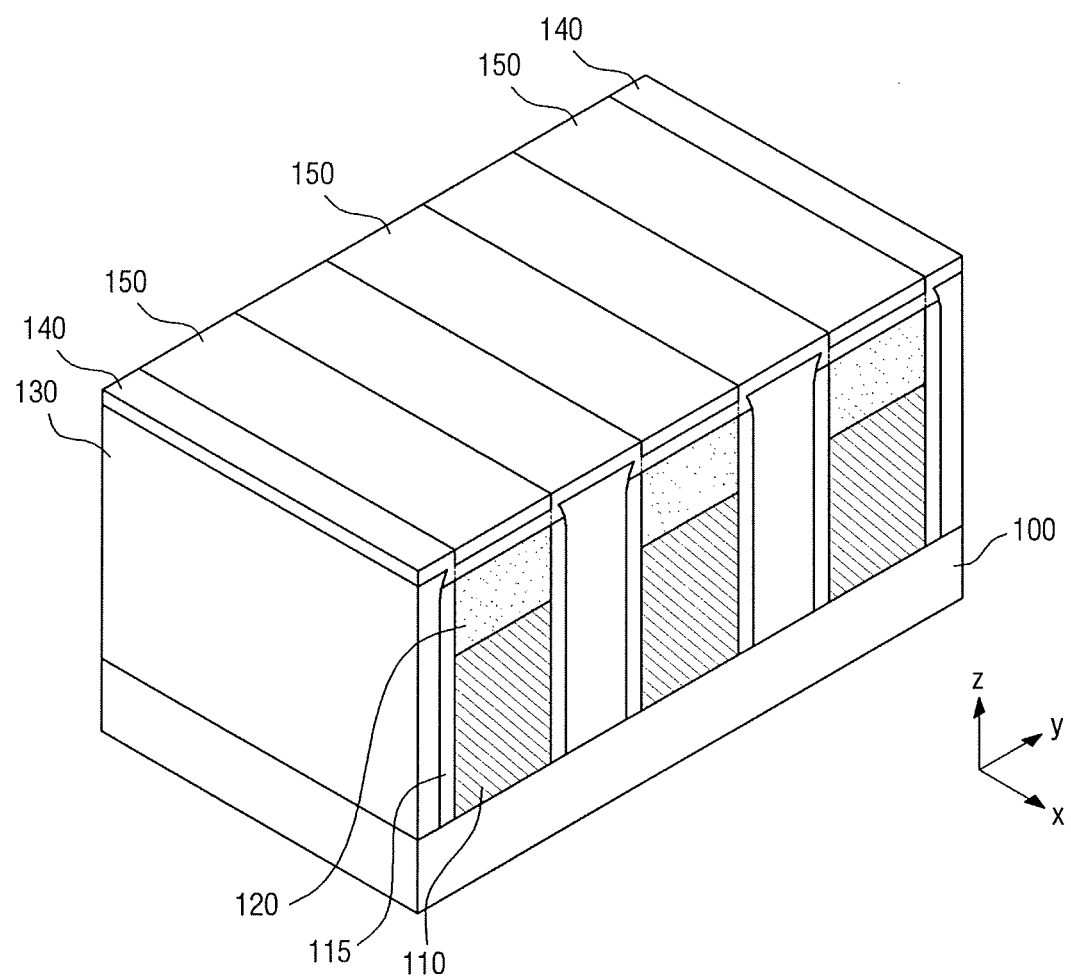

Referring to FIG. 17, a hardmask pattern 150 is formed by planarizing a top portion of the block layer 140 and a top portion of the hardmask layer. The hardmask layer 150 may be planarized by a CMP technique using the top portion of the block layer 140 as an end point or stopper. Accordingly, the hardmask patterns 150 are formed along recesses formed on the plurality of gate structures 110 and 120. As described above, a width of the hardmask pattern 150 may be equal to or larger than that of the capping layer 120.

The hardmask pattern 150 may have high etch selectivity with respect to the capping layer 120 and the first insulation layer 130. For example, the hardmask pattern 150 may include: metal, metal oxide, metal nitride, hafnium oxide (HfO), polysilicon, polymer or other suitable material. The capping layer 120 may include SiN, low-k SiN, or other low-k or ultra-low-k material, while the first insulation layer 130 may include silicon oxide. With proper choice of the etch process, the etching rate of the hardmask pattern 150 may be much slower than those of the capping layer 120 and the first insulation layer 130.

Figure 18:
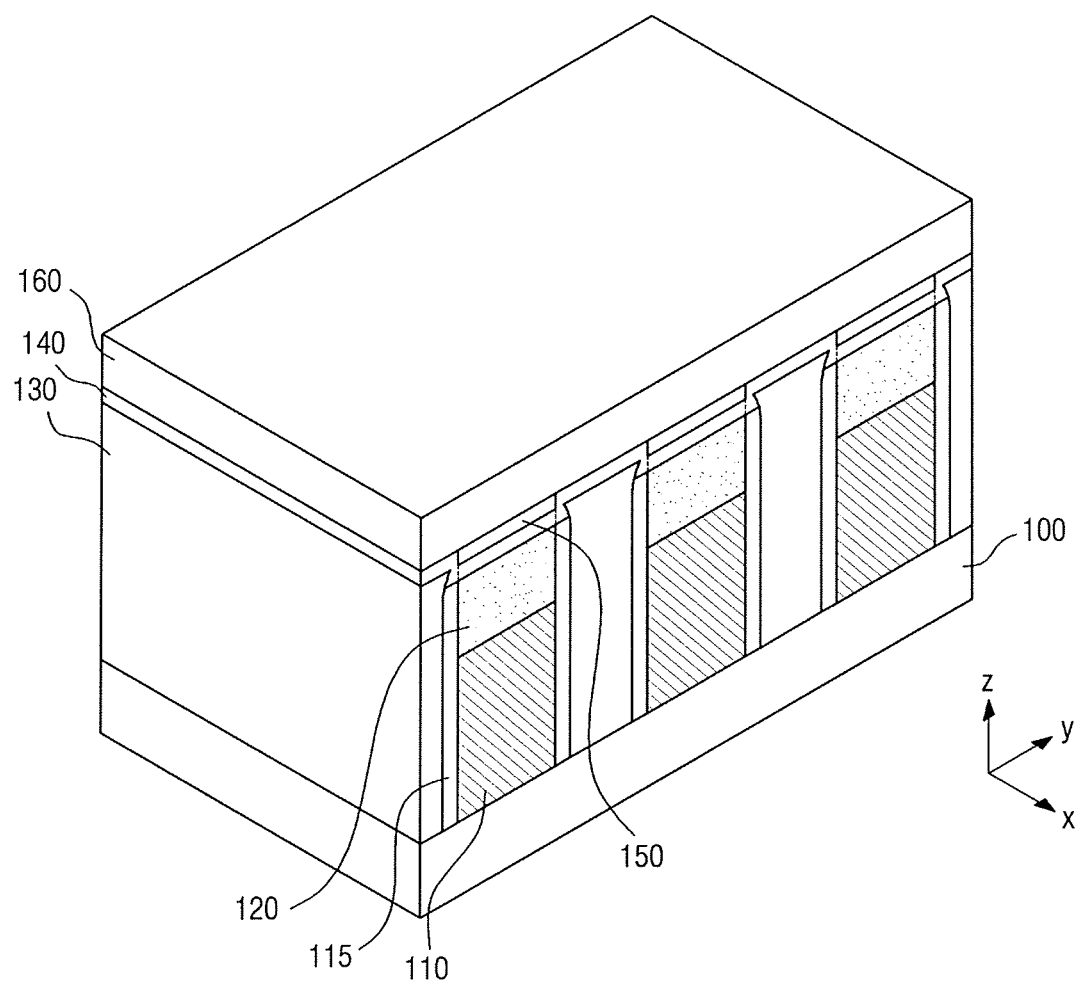

Referring to FIG. 18, a second insulation layer 160 is formed along top surface of the block layer 140 and top surface of the hardmask pattern 150. The second insulation layer 160 may include silicon oxide.

Figure 19:
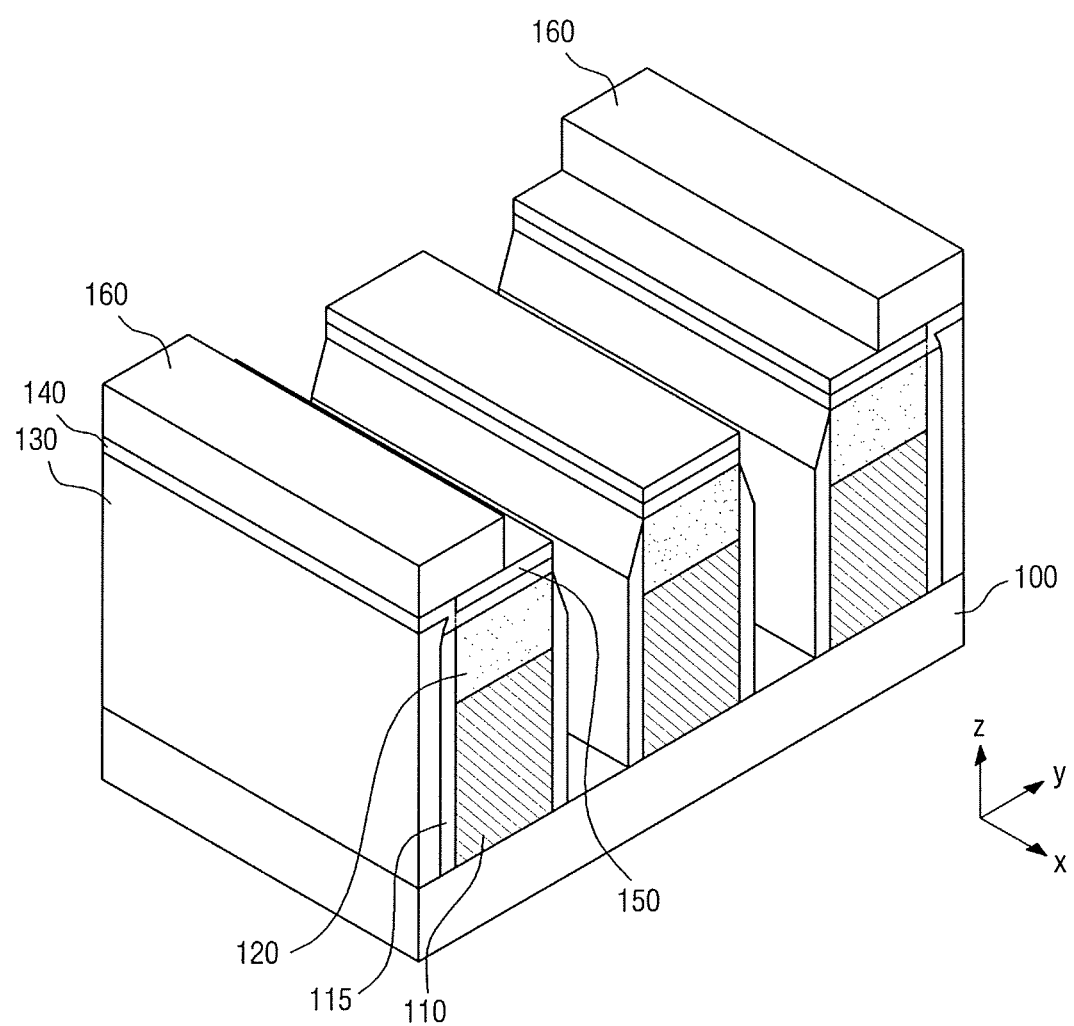

Referring to FIG. 19, portions of the second insulation layer 160 and the first insulation layer 130 are removed using the single layout 172 shown in FIG. 3. The single layout 172 may be formed with a lithographic process. The single layout 172 may be transferred to the second insulation layer 160 through etching.

Since the first insulation layer 130 and the hardmask pattern 150 have high etch selectivity with respect to each other, the first insulation layer 130 may be selectively etched with respect to the hardmask pattern 150 to remove the first insulation layer 130. When both the first insulation layer 130 and the second insulation layer 160 are silicon oxide, an oxide wet etch followed by a dry etch (RIE) process may be used to remove the second insulation layer 160 and the first insulation layer 130 under the layout 172, and to ensure better CD at the bottom. A RIE over etch may be used to ensure contact open. The dry etch RIE process for removing silicon oxide may have etchants containing fluorine, for example: CF4, and/or CF2/CH2F2.

Figure 20:
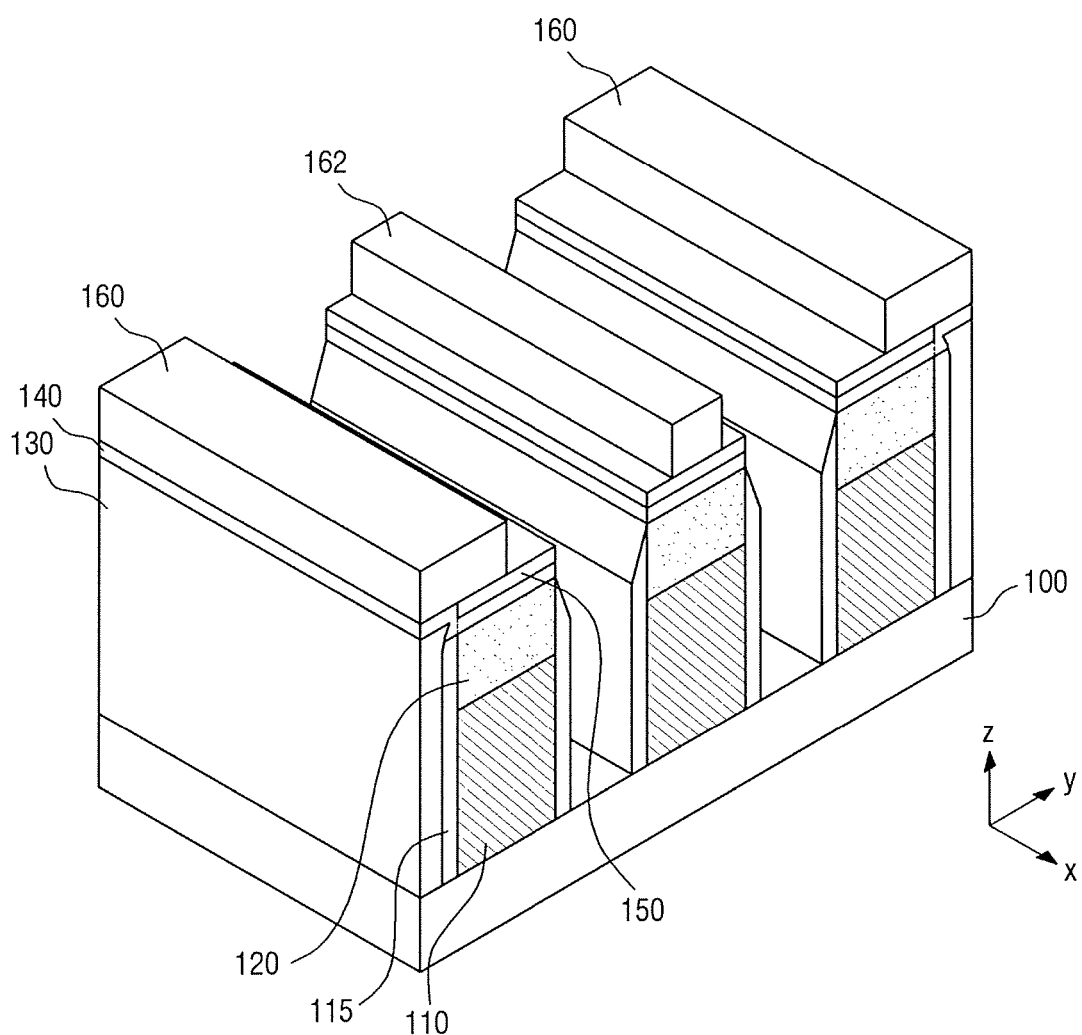

Referring to FIG. 20, unlike in FIG. 19, portions of the second insulation layer 160 and the first insulation layer 130 are removed using a plurality of layouts 172a and 172b shown in FIG. 7.

Figure 21:
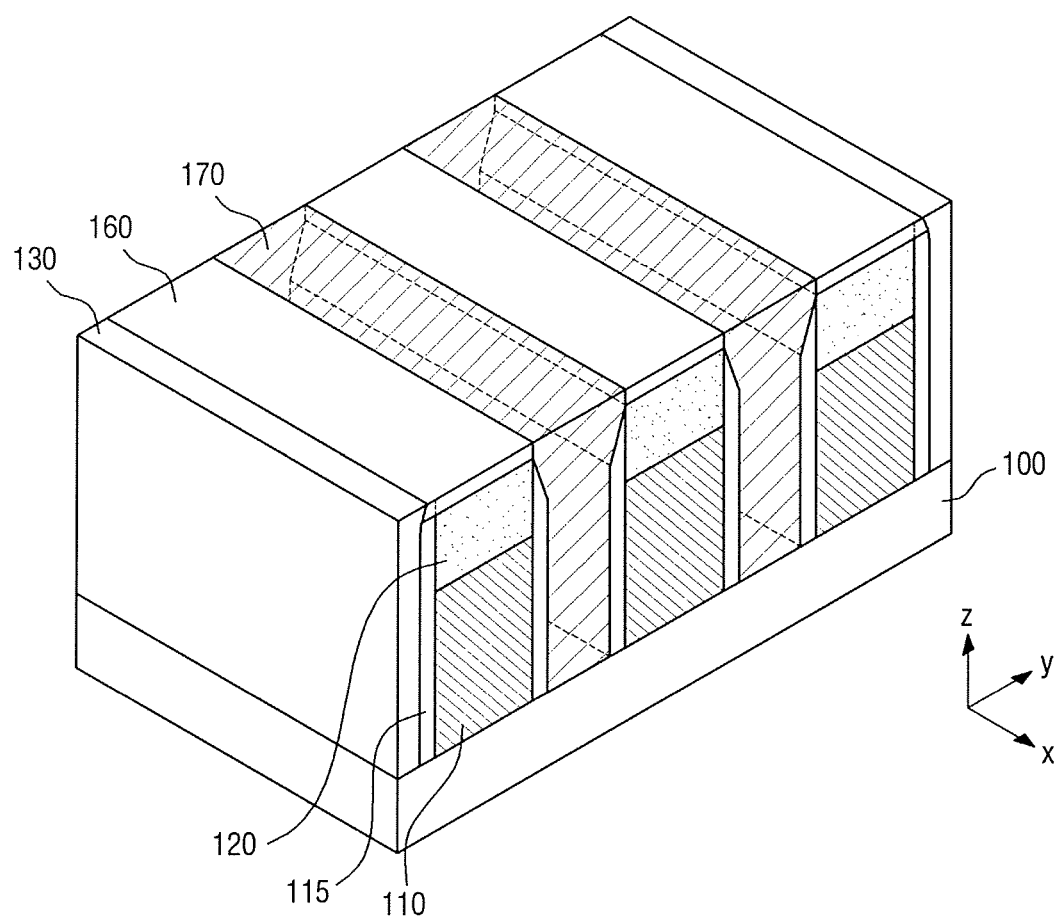

Referring to FIG. 21, contact holes shown in FIG. 19 or 20 for forming contacts 170 are filled with contact materials and top portions of the contact holes are planarized, thereby forming the contacts 170. Here, the contacts 170 are formed in a self-aligned manner with respect to the hardmask patterns 150 and the gate structures 110 and 120.

The hardmask patterns 150 according to an exemplary embodiment of the present inventive concept are formed on the gate structures 110 and 120, thereby securely protecting the gate structures 110 and 120, specifically, the conductive layers 110, during the semiconductor device manufacturing process. That is to say, the hardmask pattern 150 can perfectly protect the conductive layer 110 in an etching process for forming the contacts 170, and a sufficient margin for forming the self-aligned contacts can be secured. In addition, in the method for manufacturing the semiconductor device using the hardmask patterns 150 according to an exemplary embodiment of the present inventive concept, the self-aligned contacts can be formed around the gate structures 110 and 120. In addition, the plurality of contact holes are filled with contact materials using the single layout 172 and when necessary, the contact holes are then separated into individual contacts through, for example, planarization, thereby reducing the manufacturing cost.

Since the hardmask patterns 150 according to an exemplary embodiment of the present inventive concept can securely protect the gate structures 110 and 120, specifically, the conductive layers 110, during the semiconductor device manufacturing process, the capping layer 122 including a low-k material or an ultra-low k material having excellent characteristics may be used without an aspect of protecting the conductive layer 110 with the capping layer 122. Moreover, a contact pattern having a desired size can be easily formed just by adjusting the thickness of the block layer 140.

Figure 22:
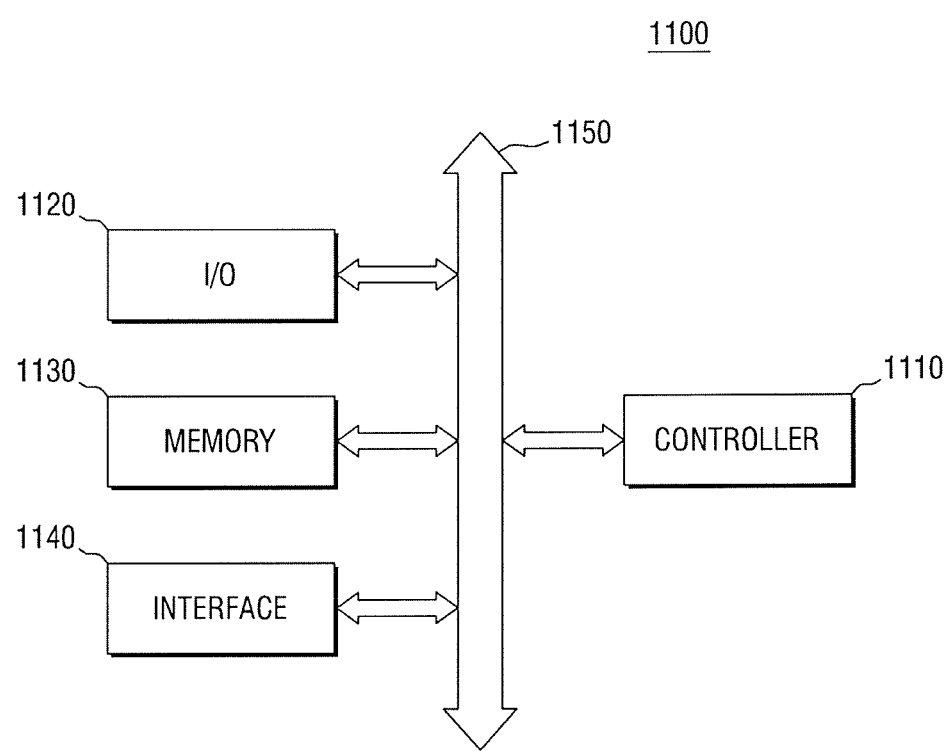
FIG. 22 is a block diagram of an electronic system including semiconductor devices according to an exemplary embodiment of the present inventive concept.

FIG. 22 is a block diagram of an electronic system including semiconductor devices according to an exemplary embodiment of the present inventive concept.

Referring to FIG. 22, the electronic system 1100 according to the present inventive concept may include a controller 1110, an input/output (I/O) device 1120, a memory device 1130, an interface 1140 and a bus 1150. The controller 1110, the I/O device 1120, the memory device 1130 and/or the interface 1140 may be connected to each other through the bus 1150. The bus 1150 may correspond to a path through which data moves.

The controller 1110 may include at least one of a microprocessor, a digital signal processor, a microcontroller, and logic devices capable of performing similar functions to those performed by these devices. The I/O device 1120 may include a keypad, a keyboard, a display device, and the like. The memory device 1130 may store data and/or instructions. The interface 1140 may transmit/receive data to/from a communication network. The interface 1140 may be wired or wireless. For example, the interface 1140 may include an antenna or a wired/wireless transceiver.

The electronic system 1100 may be used as an operating memory for improving the operation of the controller 1110 and may further include a high-speed DRAM and/or SRAM. Here, the semiconductor device according to an exemplary embodiment of the present inventive concept may be employed as the operating memory. In addition, the semiconductor device according to an exemplary embodiment of the present inventive concept may be provided within the memory device 1130 or may be provided as a component of the controller 1110 or the I/O device 1120.

The electronic system 1100 may be applied to a personal digital assistant (PDA) a portable computer, a web tablet, a wireless phone, a mobile phone, a digital music player, a memory card, and all electronic products capable of transmitting and/or receiving information in a wireless environment.

Figure 23:
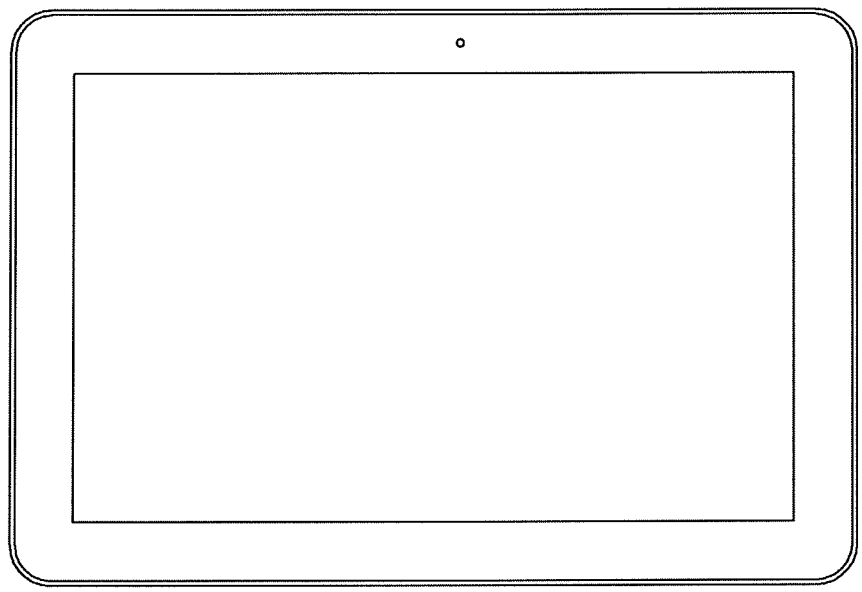
FIGS. 23 to 25 are diagrams of exemplary semiconductor systems to which semiconductor devices according to an exemplary embodiment of the present inventive concept are applied.
Figure 24:
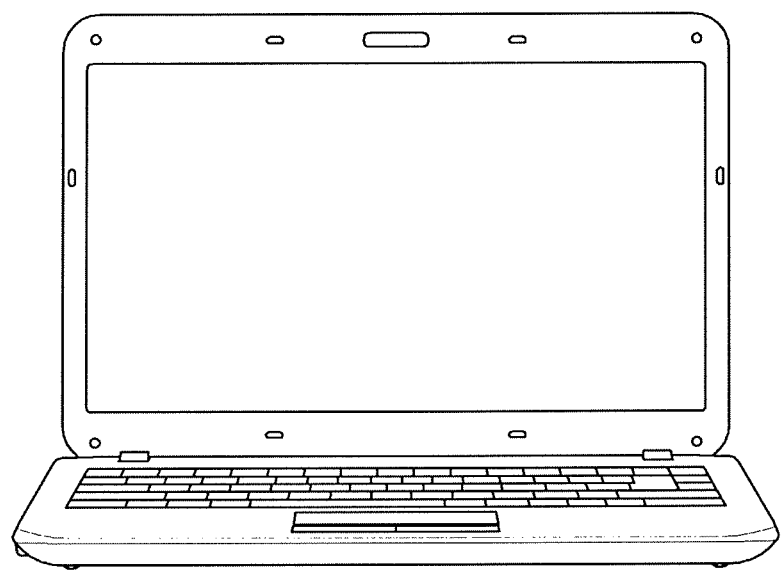
Figure 25:
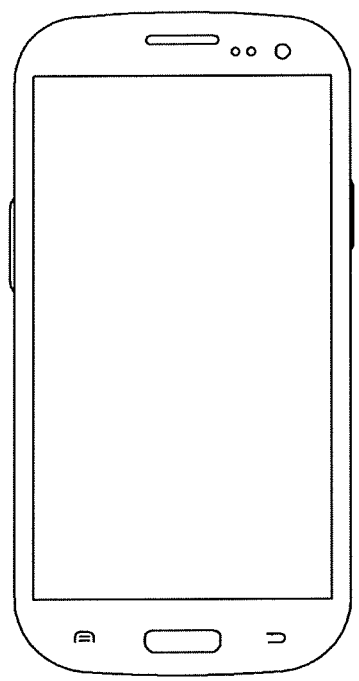

FIGS. 23 to 25 are diagrams of exemplary semiconductor systems to which semiconductor devices according to an exemplary embodiment of the present inventive concept are applied. Specifically, FIG. 23 illustrates a tablet PC (1200), FIG. 24 illustrates a notebook computer (1300), and FIG. 25 illustrates a smart phone (1400). At least one of the semiconductor devices according to an exemplary embodiment of the present inventive concept may be used in a tablet PC, a notebook computer, or the like.

It is obvious to one skilled in the art that the semiconductor device according to an exemplary embodiment of the present inventive concept can be applied to other integrated circuit devices not illustrated herein. That is to say, in the aforementioned embodiments, examples of the semiconductor systems according to an exemplary embodiment of the present inventive concept include the tablet PC 1200, the notebook computer 1300 and the smart phone 1400, but not limited thereto. In an exemplary embodiment of the present inventive concept, the semiconductor system may be implemented as one of various components of an electronic device, including, for example, a computer, an ultra mobile personal computer (UMPC), a work station, a net-book, a personal digital assistant (PDA), a portable computer, a web tablet, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, or a digital video player.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, and reference be made to the appended claims rather than the foregoing description to indicate the scope of the inventive concept.

What is claimed is:

1. A method for manufacturing a semiconductor device, the method comprising:
    forming a plurality of gate structures arranged in parallel on a substrate and being spaced apart from each other, each of the plurality of gate structures including a conductive layer and a capping layer formed on the conductive layer;
    forming a first insulation layer between each of the plurality of gate structures;
    recessing top portions of the plurality of gate structures by removing top portions of the capping layer;
    forming a block layer along a top surface of the first insulation layer and recessed top portions of the plurality of gate structures;
    forming a hardmask layer on the block layer;
    forming a hardmask pattern on each of the plurality of gate structures by planarizing a top portion of the block layer and a top portion of the hardmask layer; and
    forming a second insulation layer along a top surface of the block layer and a top surface of the hardmask pattern,
    wherein the hardmask pattern has high etch selectivity with respect to the capping layer, the block layer, and the first insulation layer.

2. The method of claim 1, wherein the first insulation layer and the capping layer of the plurality of gate structures have high etch selectivity with respect to each other, and the recessing top portions of the plurality of gate structures comprises selectively etching the top portions of the plurality of gate structures with respect to the first insulation layer.

3. The method of claim 1, wherein the capping layer includes SiN.

4. The method of claim 1, wherein the first insulation layer includes oxide.

5. The method of claim 1, wherein each of the gate structures further includes a spacer formed to cover lateral surfaces of the conductive layer and the capping layer, wherein the spacer has high etch selectivity with respect to the first insulation layer.

6. The method of claim 5, wherein the spacer includes low-k SiN.

7. The method of claim 1, wherein the hardmask layer includes at least one selected from the group consisting of metal, metal oxide, metal nitride, hafnium oxide (HfO), polysilicon, polymer, polyimide, and spin on hardmask (SOH).

8. The method of claim 1, wherein the block layer includes SiN.

9. The method of claim 1, wherein the hardmask patterns are formed along recesses formed on the plurality of gate structures.

10. The method of claim 1, wherein a width of the hardmask pattern is equal to a width of the capping layer.

11. The method of claim 1, wherein a width of the hardmask pattern is larger than a width of the capping layer.

12. The method of claim 1, wherein the forming a first insulation layer between each of the plurality of gate structures further comprises planarizing top portions of the plurality of gate structures and a top portion of the first insulation layer.

13. The method of claim 1, wherein the capping layer includes an ultra-low-k material.

14. A method for manufacturing a semiconductor device, the method comprising:
    forming a plurality of gate structures arranged in parallel on a substrate and being spaced apart from each other, each of the plurality of gate structures including a conductive layer and a capping layer formed on the conductive layer, and the capping layer including a low-k material or an ultra-low-k material;
    forming a first insulation layer between each of the plurality of gate structures;
    recessing top portions of the plurality of gate structures by removing top portions of the capping layer;
    forming a hardmask pattern having high etch selectivity with respect to the first insulation layer on each of the plurality of gate structures along recessed top surface of each of the plurality of gate structures, a width of the hardmask pattern being equal to a width of each of the plurality of gate structures; and forming contact holes between each of the plurality of gate structures using the hardmask patterns each having the width being equal to the width of each of the plurality of gate structures, wherein the capping layer and the conductive layer have the same width.

15. The method of claim 14, wherein the first insulation layer and the capping layer of the plurality of gate structures have high etch selectivity with respect to each other, and the recessing top portions of the plurality of gate structures comprises selectively etching the top portions of the plurality of gate structures with respect to the first insulation layer.

16. The method of claim 14, wherein the hardmask layer has high etch selectivity with respect to the capping layer and the first insulation layer.

17. The method of claim 14, wherein the forming a hardmask pattern comprises:

forming a block layer along a top surface of the first insulation layer and recessed top surfaces of the plurality of gate structures;

forming a hardmask layer on the block layer; and forming the hardmask pattern on each of the plurality of gate structures by planarizing a top portion of the block layer and a top portion of the hardmask layer.

18. A method for manufacturing a semiconductor device, the method comprising:

forming a plurality of gate structures arranged in parallel on a substrate and being spaced apart from each other, the substrate including a first region and a second region, each of the plurality of gate structures including a conductive layer and a capping layer formed on the conductive layer;

forming a first insulation layer between each of the plurality of gate structures;

recessing top portions of the plurality of gate structures;

forming a first block layer having a first thickness in the first region and a second block layer having a second thickness different from the first thickness in the second region, along a top surface of the first insulation layer and recessed top surfaces of the plurality of gate structures;

forming a hardmask layer on the first block layer and the second block layer;

forming a hardmask pattern on each of the plurality of gate structures by planarizing top portions of the first block layer and the second block layer, and top portion of the hardmask layer; and forming a second insulation layer along top surfaces of the first block layer and the second block layer and a top surface of the hardmask pattern.

19. The method of claim 18, wherein the hardmask pattern includes a first hardmask pattern formed on the first block layer in the first region and a second hardmask pattern formed on the second block layer in the second region, and the first hardmask pattern and the second hardmask pattern have different widths from each other.

20. A method for manufacturing a semiconductor device, the method comprising:

forming a plurality of gate structures arranged in parallel on a substrate and being spaced apart from each other, each of the plurality of gate structures including a conductive layer and a capping layer formed on the conductive layer;

forming a spacer to cover lateral surfaces of the conductive layer and the capping layer;

forming a first insulation layer between each of the plurality of gate structures;

recessing top portions of the plurality of gate structures by removing top portions of the capping layer;

forming a hardmask pattern along recessed top surface of each of the plurality of gate structures;

forming a second insulation layer along top surface of the first insulation layer and top surface of the hardmask pattern;

forming a layout for a contact pattern on the second insulation layer; and forming contact holes by removing the second insulation layer and the first insulation layer along the layout, wherein the layout includes an opening for forming two or more contact holes.

21. The method of claim 20, wherein before the forming a hardmask pattern along recessed top surface of each of the plurality of gate structures further comprises:

forming a block layer along a top surface of the first insulation layer and recessed top portions of the plurality of gate structures.

22. The method of claim 21, wherein the block layer includes SiN.

23. The method of claim 20, wherein the hardmask pattern includes at least one selected from the group consisting of metal, metal oxide, metal nitride, hafnium oxide (HfO), polysilicon, polymer, polyimide, and spin on hardmask (SOH).

24. The method of claim 20, wherein the spacer includes low-k SiN.

* * * * *